US012581999B2

(12) United States Patent
Hong et al.

(10) Patent No.: US 12,581,999 B2
(45) Date of Patent: Mar. 17, 2026

(54) SEMICONDUCTOR LIGHT EMITTING DEVICE, DISPLAY APPARATUS INCLUDING THE SAME, AND METHOD OF MANUFACTURING THE SAME

(71) Applicant: SAMSUNG ELECTRONICS CO., LTD., Suwon-si (KR)

(72) Inventors: Seogwoo Hong, Yongin-si (KR); Hyunjoon Kim, Seoul (KR); Dongkyun Kim, Suwon-si (KR); Dongho Kim, Seoul (KR); Joonyong Park, Suwon-si (KR); Kyungwook Hwang, Seoul (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 723 days.

(21) Appl. No.: 17/730,595

(22) Filed: Apr. 27, 2022

(65) Prior Publication Data

US 2023/0109184 A1     Apr. 6, 2023

(30) Foreign Application Priority Data

Oct. 5, 2021     (KR) ........................ 10-2021-0131967

(51) Int. Cl.
*H01L 25/075*     (2006.01)
*H01L 23/00*     (2006.01)
(Continued)

(52) U.S. Cl.
CPC .......... *H01L 25/0753* (2013.01); *H01L 24/95* (2013.01); *H10H 20/018* (2025.01);
(Continued)

(58) Field of Classification Search
CPC ..... H01L 25/0753; H01L 24/95; H01L 24/19; H01L 24/20; H01L 2224/19;
(Continued)

(56) References Cited

U.S. PATENT DOCUMENTS 9,142,727 B2     9/2015   Obata et al.
9,755,127 B2     9/2017   Shimojuku et al.
(Continued)

FOREIGN PATENT DOCUMENTS

CN        103119735 A      5/2013
DE     202011110832 U1    11/2016
(Continued)

OTHER PUBLICATIONS

Office Action dated Aug. 1, 2024, issued by Korean Patent Office in Korean Patent Application No. 10-2021-0131967.
(Continued)

*Primary Examiner* — Eliseo Ramos Feliciano
*Assistant Examiner* — Sophia W Kao
(74) *Attorney, Agent, or Firm* — Sughrue Mion, PLLC

(57)     ABSTRACT

Provided is a semiconductor light emitting device including a semiconductor structure including a first semiconductor layer, a light emitting layer, and a second semiconductor layer, a side extension structure disposed adjacent to a sidewall of the semiconductor structure, a first electrode having a first portion extending through the second semiconductor layer and the light emitting layer and electrically connected to the first semiconductor layer, and a second portion extending on an upper surface of the side extension structure in a horizontal direction, and a second electrode having a first portion electrically connected to the second semiconductor layer and a second portion extending on the upper surface of the side extension structure in the horizontal direction.

30 Claims, 18 Drawing Sheets

(51) Int. Cl.
    *H10H 20/01*         (2025.01)
    *H10H 20/831*      (2025.01)
    *H10H 20/857*      (2025.01)

(52) U.S. Cl.
    CPC ...... *H10H 20/8312* (2025.01); *H10H 20/857* (2025.01); *H01L 24/19* (2013.01); *H01L 24/20* (2013.01); *H01L 2224/19* (2013.01); *H01L 2224/2105* (2013.01); *H01L 2224/211* (2013.01); *H01L 2224/95102* (2013.01); *H10H 20/032* (2025.01); *H10H 20/0364* (2025.01)

(58) Field of Classification Search
    CPC ....... H01L 2224/2105; H01L 2224/211; H01L 2224/95102; H01L 2224/18; H01L 2224/95001; H10H 20/018; H10H 20/8312; H10H 20/857; H10H 20/032; H10H 20/0364; H10H 20/841; H10F 30/21; A23B 2/40; A23B 2/792; G06F 11/3698; A01N 1/146; H10D 30/0295; H10D 84/8316; H10D 84/858; F27D 17/30
    See application file for complete search history.

(56)               References Cited

U.S. PATENT DOCUMENTS

| | | | |
|---|---|---|---|
| 2017/0194541 A1 | 7/2017 | Huang et al. | |
| 2017/0263837 A1* | 9/2017 | Jeon | H01L 24/96 |
| 2018/0012949 A1* | 1/2018 | Takeya | H10K 50/84 |
| 2018/0102350 A1 | 4/2018 | Kim et al. | |
| 2019/0006564 A1 | 1/2019 | Sasaki et al. | |
| 2019/0019786 A1* | 1/2019 | Kim | H01L 24/742 |
| 2019/0051802 A1 | 2/2019 | Perzlmaier et al. | |
| 2019/0198738 A1 | 6/2019 | Nakabayashi et al. | |
| 2021/0083155 A1* | 3/2021 | Seo | H10H 20/8582 |
| 2021/0090909 A1 | 3/2021 | Yang et al. | |
| 2021/0119079 A1 | 4/2021 | Hwang et al. | |
| 2021/0313305 A1 | 10/2021 | Bibl et al. | |
| 2022/0231000 A1* | 7/2022 | Chang | H10H 20/018 |
| 2022/0285581 A1* | 9/2022 | Hong | H10H 20/8312 |

FOREIGN PATENT DOCUMENTS

| | | |
|---|---|---|
| EP | 3503225 A1 | 6/2019 |
| JP | 6159477 B2 | 7/2017 |
| JP | 6306308 B2 | 4/2018 |
| KR | 10-2012-0031342 A | 4/2012 |
| KR | 10-2021-0047695 A | 4/2021 |
| WO | 2021/006385 A1 | 1/2021 |

OTHER PUBLICATIONS

Communication dated Nov. 25, 2022 issued by the European Patent Office in application No. 22178141.2.
Office Action issued on Aug. 14, 2025 by the Chinese Patent Office in corresponding CN Patent Application No. 202210661382.7.

* cited by examiner

FIG. 1A
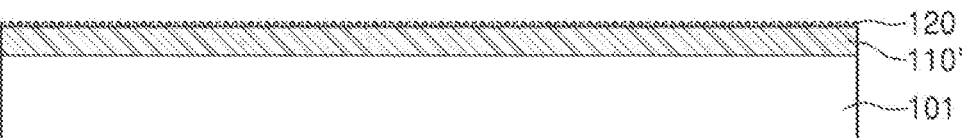
FIG. 1B
FIG. 1C
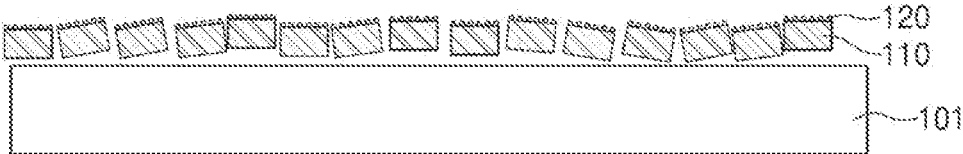

SEMICONDUCTOR LIGHT EMITTING DEVICE, DISPLAY APPARATUS INCLUDING THE SAME, AND METHOD OF MANUFACTURING THE SAME

CROSS-REFERENCE TO RELATED APPLICATION

This application is based on and claims priority under 35 U.S.C. § 119 to Korean Patent Application No. 10-2021-0131967, filed on Oct. 5, 2021, in the Korean Intellectual Property Office, the disclosure of which is incorporated by reference herein in its entirety.

BACKGROUND

1. Field

Example embodiments of the present disclosure relate to a semiconductor light emitting device, a display apparatus including the same, and a method of manufacturing the semiconductor light emitting device.

2. Description of Related Art

Light emitting diodes (LEDs), which consume low power and are eco-friendly, have increased in industrial demand and have been applied as display pixels, as well as used as pixels of display apparatuses, as well as used as backlights of lighting devices or liquid crystal displays (LCDs) Recently, micro LED display apparatuses using a micro LED chip as a pixel have been developed.

However, as the size of the micro LED chip decreases, a gap between electrodes becomes narrower, so that when the micro LED chip is transferred onto a display substrate, a possibility of defects due to an alignment error increases. In order to prevent defects due to such an alignment error, there may be a limitation in reducing the chip size.

SUMMARY

One or more example embodiments provide semiconductor light emitting devices configured to reduce the possibility of defects due to an alignment error when transferring the semiconductor light emitting devices onto a display substrate.

One or more example embodiments also provide semiconductor light emitting devices having a sufficiently large gap between electrodes, while reducing a size of a semiconductor chip of the semiconductor light emitting devices.

One or more example embodiments also provide methods of manufacturing a semiconductor light emitting device having a sufficiently large gap between electrodes, while reducing a size of a semiconductor chip of the semiconductor light emitting device.

One or more example embodiments also provide micro LED display apparatuses including a semiconductor light emitting device.

Additional aspects will be set forth in part in the description which follows and, in part, will be apparent from the description, or may be learned by practice of example embodiments.

According to an aspect of an example embodiment, there is provided a semiconductor light emitting device including a semiconductor structure including a first semiconductor layer, a light emitting layer, and a second semiconductor layer, a side extension structure disposed adjacent to a sidewall of the semiconductor structure, a first electrode having a first portion extending through the second semiconductor layer and the light emitting layer and electrically connected to the first semiconductor layer, and a second portion extending on an upper surface of the side extension structure in a horizontal direction, and a second electrode having a first portion electrically connected to the second semiconductor layer and a second portion extending on the upper surface of the side extension structure in the horizontal direction.

A portion of the second portion of the first electrode and a portion of the second portion of the second electrode may extend by the sidewall of the semiconductor structure in the horizontal direction and may be disposed on the side extension structure.

The semiconductor light emitting device may further include an insulating layer disposed on a surface of the second semiconductor layer and a surface of the side extension structure.

The insulating layer may be disposed adjacent to a sidewall of the first portion of the first electrode inside the second semiconductor layer and the light emitting layer such that the first electrode is spaced apart from the second semiconductor layer and the light emitting layer, and wherein the first portion of the second electrode may be in contact with the second semiconductor layer through the insulating layer.

The second portion of the first electrode and the second portion of the second electrode may be disposed on a surface of the insulating layer.

The side extension structure may include a first side extension structure spaced apart from the sidewall of the semiconductor structure and disposed adjacent to the sidewall of the semiconductor structure, and a second side extension structure disposed between the sidewall of the semiconductor structure and the first side extension structure.

The second side extension structure may extend to an upper surface of the first side extension structure.

The semiconductor light emitting device may further include a first bump disposed on the first electrode, and a second bump disposed on the second electrode.

At least a portion of the first bump and at least a portion of the second bump may extend adjacent to the sidewall of the semiconductor structure and face a surface of the side extension structure.

The semiconductor light emitting device may further include a functional layer disposed on a surface of the second semiconductor layer and including a metal or a transparent conductor.

A width or diameter of the semiconductor structure may range from 1 μm to 100 μm.

A width or diameter of the semiconductor light emitting device may be 1.5 to 2.5 times the width or diameter of the semiconductor structure.

According to another aspect of an example embodiment, there is provided a display apparatus including a display substrate including a driving circuit, and a plurality of semiconductor light emitting devices disposed on the display substrate, wherein each of the semiconductor light emitting devices includes a semiconductor structure including a first semiconductor layer, a light emitting layer, and a second semiconductor layer, a side extension structure disposed adjacent to a sidewall of the semiconductor structure, a first electrode having a first portion extending through the second semiconductor layer and the light emitting layer and electrically connected to the first semiconductor layer, and a second portion extending on an upper surface of the side extension structure in a horizontal direction, and a second electrode having a first portion electrically connected to the second semiconductor layer and a second portion extending on the upper surface of the side extension structure in the horizontal direction.

The plurality of semiconductor light emitting devices may include a first semiconductor light emitting device and a second semiconductor light emitting device disposed adjacent to each other, and the first semiconductor light emitting device and the second semiconductor light emitting device may share a single side extension structure disposed between the first semiconductor light emitting device and the second semiconductor light emitting device.

The plurality of semiconductor light emitting devices may be integrally formed.

The display apparatus may further include a wavelength conversion layer configured to convert a wavelength of light emitted from the plurality of semiconductor light emitting devices.

The wavelength conversion layer may include a first wavelength conversion layer configured to convert light emitted from the plurality of semiconductor light emitting devices into light having a first wavelength band, and a second wavelength conversion layer configured to convert light emitted from the plurality of semiconductor light emitting devices into light having a second wavelength band different from the first wavelength band.

The display apparatus may further include a color filter layer including a first filter facing the first wavelength conversion layer and configured to transmit light having the first wavelength band, and a second color filter layer facing the second wavelength conversion layer and configured to transmit light having the second wavelength band.

A portion of the second portion of the first electrode and a portion of the second portion of the second electrode may extend adjacent to the sidewall of the semiconductor structure in the horizontal direction and are disposed on the side extension structure.

Each of the semiconductor light emitting devices may further include an insulating layer disposed on a surface of the second semiconductor layer and a surface of the side extension structure.

The insulating layer may be disposed adjacent to a sidewall of the first portion of the first electrode inside the second semiconductor layer and the light emitting layer such that the first electrode is spaced apart from the second semiconductor layer and the light emitting layer, and wherein the first portion of the second electrode may be in contact with the second semiconductor layer through the insulating layer.

The second portion of the first electrode and the second portion of the second electrode may be disposed on a surface of the insulating layer.

The side extension structure may include a first side extension structure spaced apart from the sidewall of the semiconductor structure and disposed adjacent to the sidewall of the semiconductor structure, and a second side extension structure disposed between the sidewall of the semiconductor structure and the first side extension structure.

The second side extension structure may extend to an upper surface of the first side extension structure.

Each of the semiconductor light emitting devices may include a first bump disposed on the first electrode, and a second bump disposed on the second electrode.

At least a portion of the first bump and at least a portion of the second bump may extend adjacent to the sidewall of the semiconductor structure and face a surface of the side extension structure.

Each of the semiconductor light emitting devices may include a functional layer disposed on a surface of the second semiconductor layer and including a metal or a transparent conductor.

A width or diameter of the semiconductor structure may range from 1 μm to 100 μm.

A width or diameter of each of the semiconductor light emitting devices may be 1.5 to 2.5 times the width or diameter of the semiconductor structure.

According to another aspect of an example embodiment, there is provided a method of manufacturing a semiconductor light emitting device, the method including forming a semiconductor structure on a growth substrate, forming the semiconductor structure including forming a first semiconductor layer, forming a light emitting layer, and forming a second semiconductor layer, transferring the semiconductor structure to a recess of a transfer substrate including a barrier in which the recess is formed, filling the recess of the transfer substrate with a fixing layer to fix the semiconductor structure, and forming a first electrode having a first portion extending through the second semiconductor layer and the light emitting layer and electrically connected to the first semiconductor layer and a second portion extending to a surface of the fixing layer and a surface of the barrier in a horizontal direction and a second electrode having a first portion electrically connected to the second semiconductor layer and extending to the surface of the fixing layer and the surface of the barrier in the horizontal direction.

The forming of the first electrode and the second electrode may include forming a first via hole extending through the second semiconductor layer and the light emitting layer such that a portion of the first semiconductor layer is exposed, forming an insulating layer on a surface of the fixing layer, a surface of the second semiconductor layer, and the first via hole, forming a second via hole extending through the insulating layer such that a portion of the second semiconductor layer is exposed, forming a conductive material inside the first via hole and on the surface of the fixing layer and the surface of the barrier to form the first electrode, and forming a conductive material inside the second via hole and on the surface of the fixing layer and the surface of the barrier to form the second electrode.

The forming of the semiconductor structure may further include forming a functional layer including a metal or transparent conductor on a surface of the second semiconductor layer.

The method may further include forming a first bump on the first electrode, and forming a second bump disposed on the second electrode.

At least a portion of the first bump and at least a portion of the second bump may be formed to extend adjacent to a sidewall of the semiconductor structure and face the surface of the fixing layer and the surface of the barrier.

A width or diameter of the semiconductor structure may be formed to range from 1 μm to 100 μm.

An interval between centers of barriers disposed on both sides of the semiconductor structure may be formed to be 1.5 to 2.5 times the width or diameter of the semiconductor structure.

According to another aspect of an example embodiment, there is provided a semiconductor light emitting device including a semiconductor structure including a first semiconductor layer, a light emitting layer, and a second semiconductor layer, a side extension structure extending adjacent to a sidewall of the semiconductor structure, a first electrode including a first portion extending in a vertical direction through the second semiconductor layer and the light emitting layer and in contact with the first semiconductor layer, and a second portion extending on an upper surface of the side extension structure in a horizontal direction; and a second electrode including a first portion extending in the vertical direction and in contact with the second semiconductor layer, and a second portion extending on the upper surface of the side extension structure in the horizontal direction.

BRIEF DESCRIPTION OF THE DRAWINGS

The above and/or other aspects, features, and advantages of example embodiments will be more apparent from the following description taken in conjunction with the accompanying drawings, in which:

FIGS. 1A, 1B, and 1C are cross-sectional views schematically illustrating a process of forming and separating a plurality of semiconductor structures on a growth substrate according to an example embodiment;

DETAILED DESCRIPTION

Figures 2, 3:
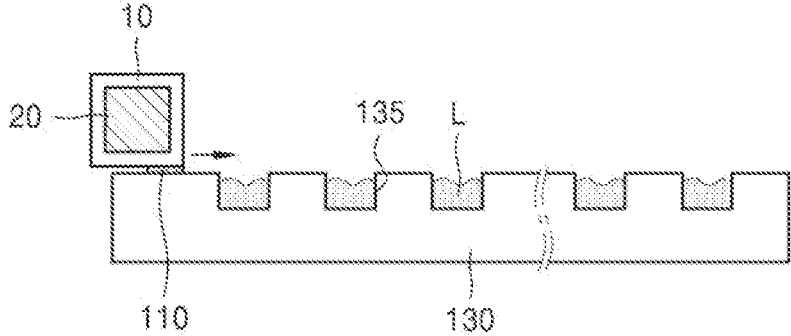
FIG. 2 is a perspective view illustrating a method of aligning semiconductor structures using a fluid self-assembly method according to an example embodiment.
FIG. 3 schematically shows a scanning process for aligning a semiconductor structure according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a semiconductor light emitting device, a display apparatus including the same, and a method of manufacturing the semiconductor light emitting device are described in detail with reference to the accompanying drawings. Like reference numerals in the drawings denote like elements, and, in the drawings, the sizes of elements may be exaggerated for clarity and for convenience of explanation. The embodiments described hereinafter are merely examples, and various modifications may be made from these embodiments Hereinafter, when it is described that a certain component is "above" or "on" another component, the certain component may be directly above another component, or a third component may be interposed therebetween. An expression in the singular includes an expression in the plural unless they are clearly different from each other in context. In addition, when a certain part "includes" a certain component, this indicates that the part may further include another component instead of excluding another component unless there is different disclosure.

The use of the term "the" and similar referential terms may refer to both the singular and the plural. The steps of methods described herein may be performed in any suitable order unless otherwise indicated herein or otherwise clearly contradicted by context, and embodiments of the present disclosure are not limited to the described order of the processes In addition, the term, such as " . . . unit" or "module," disclosed in the specification indicates a unit for processing at least one function or operation, and this may be implemented by hardware, software, or a combination thereof.

The connections or connecting members of lines between the components illustrated in the drawings represent functional connections and/or physical or circuit connections, which may be represented as various replaceable or additional functional connections, physical connections or circuit connections in actual devices The use of any and all examples, or exemplary language provided herein, is intended merely to better illuminate the inventive concept and does not pose a limitation on the scope of the inventive concept unless otherwise claimed.

FIGS. 1A to 1C are cross-sectional views schematically illustrating a process of forming and separating a plurality of semiconductor structures on a growth substrate 101 according to an example embodiment.

First, referring to FIG. 1A, an epitaxial layer 110' for manufacturing a semiconductor light emitting device may be formed on the growth substrate 101. For example, when the semiconductor light emitting device is a light emitting diode (LED), the epitaxial layer 110' may have a structure in which an n-type semiconductor layer, a light emitting layer, and a p-type semiconductor layer are sequentially stacked. When the semiconductor light emitting device is a vertical-cavity surface-emitting laser (VCSEL), the epitaxial layer 110' may have a structure in which an n-type reflective layer, an n-type semiconductor layer, a light emitting layer, a p-type semiconductor layer, and a p-type reflective layer are sequentially stacked. A detailed structure and manufacturing method of the epitaxial layer 110' may use a related technique, and thus, a detailed description thereof is omitted.

In addition, referring to FIG. 1A, a functional layer 120 including a metal or a transparent conductor may be further formed on the epitaxial layer 110'. The functional layer 120 may provide a surface energy difference from a bottom surface of a transfer substrate during a transfer process to be described below, and may serve as a reflective layer or a current diffusion layer after the semiconductor light emitting device is completed. The functional layer 120 may be a flat thin film covering the entire upper surface of the epitaxial layer 110' or may be patterned.

Referring to FIG. 1B, the epitaxial layer 110' may be etched to form a plurality of semiconductor structures 110. Thereafter, referring to FIG. 1C, the semiconductor structures 110 may be detached from the growth substrate 101 by, for example, a chemical lift-off (CLO) method. A size of each of the semiconductor structures 110 may vary depending on the use, and the semiconductor structures 110 may be separated to have a desired size during a dicing process. For example, the semiconductor structures 110 detached from the growth substrate 101 may have a form of a thin disk or a flake. When the semiconductor structure 110 is used as a micro LED mounted on a display apparatus, a width or diameter of the semiconductor structure 110 may be, for example, in the range of 1 μm to 100 μm.

In the process illustrated in FIG. 1C, an electrode is not formed on each of the semiconductor structures 110. In order to form an electrode on each of the semiconductor structures 110 to complete forming a semiconductor light emitting device, the semiconductor structures 110 may be transferred onto a separate transfer substrate. In order to transfer the semiconductor structures 110 onto the separate transfer substrate, for example, a fluidic self-assembly method may be used.

FIG. 2 is a perspective view schematically illustrating a method of aligning a semiconductor structure 110 using a fluidic self-assembly method according to an example embodiment. Referring to FIG. 2, the semiconductor structures 110 may be provided on the upper surface of a transfer substrate 130 having a plurality of recesses 135, which are two-dimensionally arranged. The semiconductor structures 110 may be directly scattered onto the transfer substrate 130 after a liquid is supplied to the recesses 135 of the transfer substrate 130 or may be included in a suspension and supplied to the transfer substrate 130.

The liquid supplied to the recess 135 may be any kind of liquid as long as the liquid does not corrode or damage the semiconductor structure 110 and may be supplied to the recess 135 by various methods such as a spray method, a dispensing method, an inkjet dot method, or a method of allowing a liquid to flow to the transfer substrate 130. The liquid may include, for example, one of a plurality of groups consisting of water, ethanol, alcohol, polyol, ketone, halocarbon, acetone, flux, and an organic solvent or a combination thereof. The organic solvent may include, for example, isopropyl alcohol (IPA). The amount of supplied liquid may be adjusted to vary such that the liquid fits the recess 135 or overflows from the recess 15.

The semiconductor structures 110 may be directly scattered onto the transfer substrate 130 without any other liquid or may be included in a suspension and supplied onto the transfer substrate 130. As a method of supplying the semiconductor structure 110 included in the suspension, various methods such as a spray method, a dispensing method of dropping a liquid in drops, an inkjet dot method of discharging a liquid like a printing method, a method of allowing the suspension to flow to the transfer substrate 130, and the like may be used.

FIG. 3 schematically illustrates a scanning process for aligning the semiconductor structure 110 according to an example embodiment. Referring to FIG. 3, an absorber 10 may scan the transfer substrate 130. As the absorber 10 in contact with the transfer substrate 130 passes the recesses 135 according to the scanning, the semiconductor structure 110 may be moved into the recesses 135 and the absorber 10 may also absorb a liquid L present in the recesses 135. The absorber 10 may be any material as long as the material is capable of absorbing the liquid L and a shape or structure thereof is not limited. The absorber 10 may include, for example, fabric, tissue, polyester fiber, paper, or a wiper.

The absorber 10 may be used alone without other auxiliary devices, but is not limited thereto. For example, the absorber 10 may be coupled to a support 20 for facilitating scanning of the transfer substrate 130. The support 20 may have various shapes and structures suitable for scanning the transfer substrate 130. For example, the support 20 may have a shape of a rod, a blade, a plate, a wiper, or the like. The absorber 10 may be provided on any one side of the support 20 or may be wrapped around the support 20. The shapes of the support 20 and the absorber 10 are not limited to the illustrated quadrangular cross-sectional shape and may have a circular cross-sectional shape.

The absorber 10 may scan the transfer substrate 130, while pressing the transfer substrate 130 with an appropriate pressure. Scanning may be performed according to various methods, for example, a sliding method, a rotating method, a translation method, a reciprocating method, a rolling method, a spinning method, and/or a rubbing method of the absorber 10, which may include both a regular method or an irregular method. Scanning may be performed by moving the transfer substrate 130 instead of moving the absorber 10, and scanning of the transfer substrate 130 may also be performed in a manner such as sliding, rotation, translational reciprocation, rolling, spinning, and/or rubbing. In addition, scanning may also be performed by cooperation between the absorber 10 and the transfer substrate 130.

The supplying of the liquid L to the recess 135 of the transfer substrate 130 and the supplying of the semiconductor structure 110 to the transfer substrate 130 may be performed in a reverse order of the order described above. In addition, the supplying of the liquid L to the recess 135 of the transfer substrate 130 and the supplying of the semiconductor structure 110 to the transfer substrate 130 may be simultaneously performed in one step. For example, by supplying a suspension containing the semiconductor structure 110 to the transfer substrate 130, the liquid L and the semiconductor structure 110 may be simultaneously supplied to the transfer substrate 130. After the absorber 10 scans the transfer substrate 130, the semiconductor structure 110 remaining in the transfer substrate 130 without entering the recess 135 may be removed. In addition, the processes described above may be repeated until the semiconductor structures 110 are seated in all the recesses 135. As described above, a large number of semiconductor structures 110 may be aligned on the transfer substrate 130, which has a large area, using the fluid self-assembly method.

FIGS. 4A to 4E are cross-sectional views schematically illustrating a process of forming an electrode on the semiconductor structure 110 on the transfer substrate 130 according to an example embodiment.

Figure 4A:
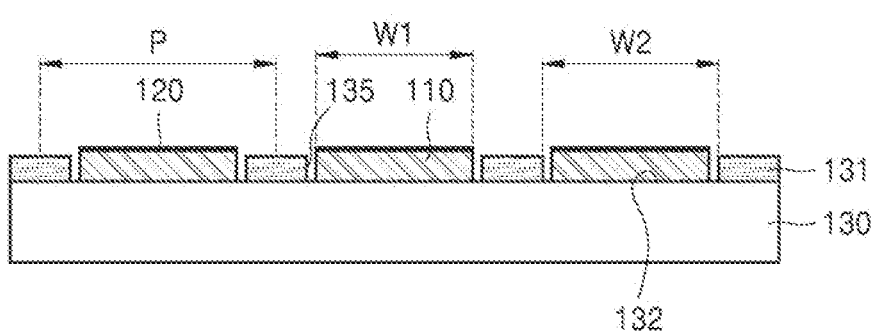
FIGS. 4A, 4B, 4C, 4D, and 4E are cross-sectional views schematically illustrating a process of forming an electrode on a semiconductor structure on a transfer substrate according to an example embodiment.

Referring to FIG. 4A, the transfer substrate 130 may include a plurality of barriers 131 disposed on an upper surface of the transfer substrate 130 and having a plurality of recesses 135. The barrier 131 may be formed of an insulating dielectric material. A sacrificial layer may be further disposed between the barrier 131 and the transfer substrate 130 or the transfer substrate 130 may be formed as a thin film so that the barrier 131 may be more easily separated from the transfer substrate 130 in a process of separating the semiconductor light emitting device to be described below. A thickness of the barrier 131 may be slightly greater than or slightly less than a thickness of the semiconductor structure 110. For example, the thickness of the barrier 131 may be 0.8 to 1.2 times the thickness of the semiconductor structure 110.

Using the fluid self-assembly method described above, one semiconductor structure 110 is disposed in each recess 135, and the barrier 131 may be provided adjacent to and surround the semiconductor structure 110. The semiconductor structure 110 may be disposed such that the functional layer 120 including a metal or a transparent conductor faces upward, that is, outward of the recess 135, and a lower surface of the semiconductor structure 110 is in contact with a bottom surface 132 of the recess 135. To this end, the bottom surface 132 of the recess 135 that comes into contact with the lower surface of the semiconductor structure 110 may be formed of a dielectric material having a very smooth surface to have high hydrophilicity. For example, a root mean square (RMS) roughness of the bottom surface 132 of the recess 135 may be less than or equal to about 50 nm. In addition, the lower surface of the semiconductor structure 110 in contact with the bottom surface 132 of the recess 135 may also have hydrophilicity and may have an RMS roughness less than or equal to about 50 nm.

In addition, the functional layer 120 including a metal or a transparent conductor has a large surface energy difference from the bottom surface 132 of the recess 135. Accordingly, during the fluid self-assembly method, the functional layer 120 having a large surface energy difference from the bottom surface 132 of the recess 135 naturally faces the outside of the recess 135, and the lower surface of the semiconductor structure 110 is more easily in contact with the bottom surface 132. In addition, the functional layer 120 may allow the semiconductor structure 110 remaining in the recess 135 without being transferred to be more easily separated from the transfer substrate 130 during a cleaning process.

A width or diameter W2 of the recess 135 may be sufficiently greater than a width or diameter W1 of the semiconductor structure 110 so that the semiconductor structure 110 may be more easily disposed within the recess 135. For example, the width or diameter W2 of the recess 135 may be 1.2 to 2 times the width or diameter W1 of the semiconductor structure 110. In addition, a distance between the centers of two adjacent barriers 131 or a pitch P of the barriers 131 may be appropriately selected according to a position of an electrode formed in a subsequent process and a width or diameter of the semiconductor light emitting device. For example, the pitch P of the barriers 131 may be 1.5 to 3 times the width or diameter W1 of the semiconductor structure 110.

Figure 4B:
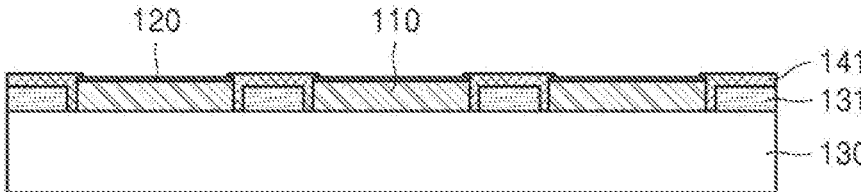

Referring to FIG. 4B, a gap between the semiconductor structure 110 and the barrier 131 may be filled with a fixing layer 141 so that the semiconductor structure 110 may be fixed in the recess 135. For example, after the entire upper surface of the transfer substrate 130 is coated with a material of the fixing layer 141, the material of the fixing layer 141 may be partially removed so that an upper surface of the semiconductor structure 110 is exposed. The material of the fixing layer 141 may be, for example, a photocurable polymer. Then, after filling the gap between the semiconductor structure 110 and the barrier 131 with the material of the fixing layer 141, the fixing layer 141 may be formed by irradiating ultraviolet rays, for example. Accordingly, the semiconductor structure 110 may be firmly fixed in the recess 135. In FIG. 4B, the fixing layer 141 is illustrated to remain on an upper surface of the barrier 131, but embodiments are not limited thereto. For example, the fixing layer 141 may be disposed only between the semiconductor structure 110 and the barrier 131, and the fixing layer 141 may not be disposed on the upper surface of the barrier 131.

Figure 4C:
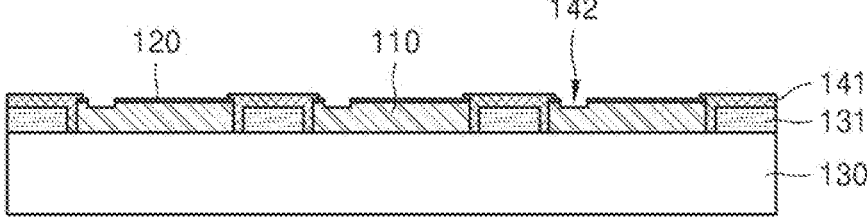
Figure 5A:
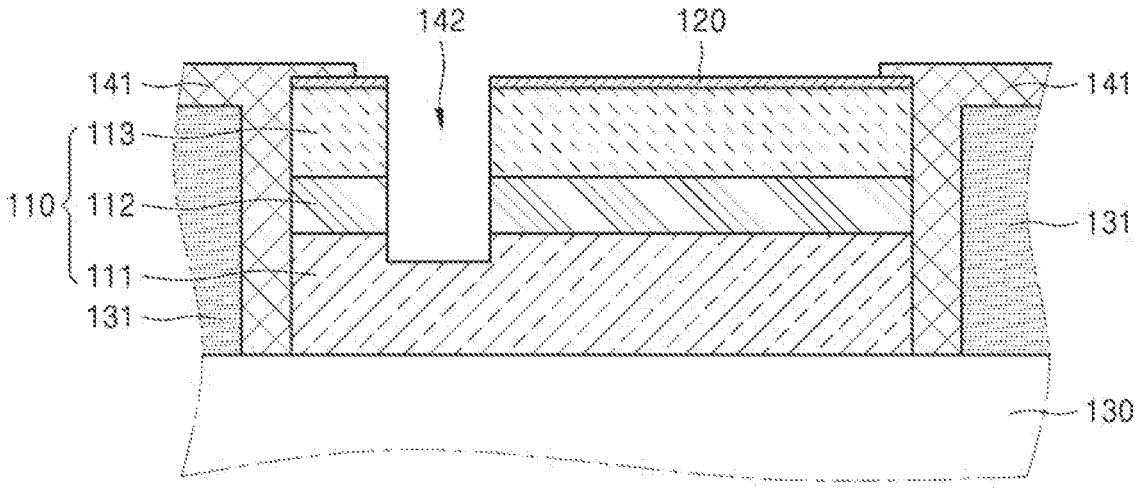
FIG. 5A is a cross-sectional view illustrating a structure after performing a process illustrated in FIG. 4C.

Referring to FIG. 4C, a first via hole 142 may be formed in the semiconductor structure 110. The first via hole 142 may be formed so that a first semiconductor layer of the semiconductor structure 110 is exposed. FIG. 5A is a cross-sectional view illustrating a structure after performing the process illustrated in FIG. 4C. Referring to FIG. 5A, the semiconductor structure 110 may include a first semiconductor layer 111, a light emitting layer 112, and a second semiconductor layer 113 that are sequentially stacked. The first semiconductor layer 111 and the second semiconductor layer 113 may be electrically doped in opposite types. For example, the first semiconductor layer 111 may be doped n-type and the second semiconductor layer 113 may be doped a p-type, or the first semiconductor layer 111 may be doped a p-type and the second semiconductor layer 113 may be doped n-type. The light emitting layer 112 may have, for example, a quantum well structure or a multi-quantum well structure. The first via hole 142 may be formed to extend through the functional layer 120, the second semiconductor layer 113, and the light emitting layer 112 through etching. In this process, a portion of the first semiconductor layer 111 may also be slightly etched, and an upper portion of the first semiconductor layer 111 may be exposed.

Figure 4D:
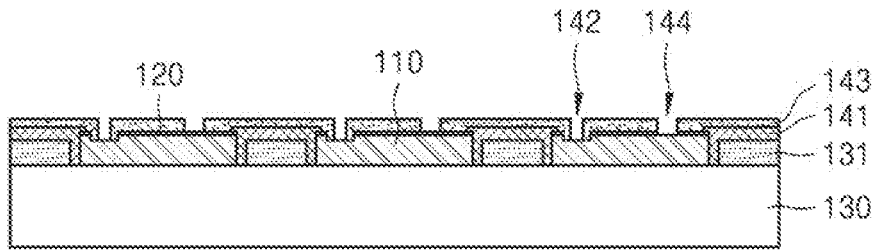
Figure 5B:
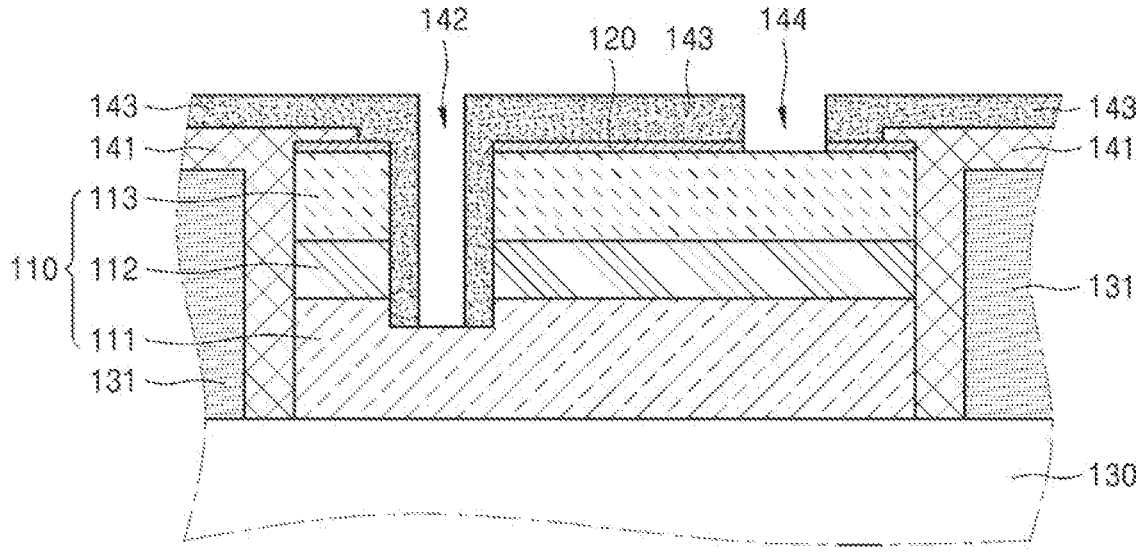
FIG. 5B is a cross-sectional view illustrating a structure after performing a process illustrated in FIG. 4D.

Referring to FIG. 4D, an insulating layer 143 covering an inner wall of the first via hole 142 and the upper surface of the semiconductor structure 110 may be formed. In addition, the insulating layer 143 may be etched to form a second via hole 144 to expose a portion of the upper surface of the semiconductor structure 110. FIG. 5B is a cross-sectional view illustrating a structure after performing the process illustrated in FIG. 4D. Referring to FIG. 5B, the insulating layer 143 may completely cover an inner sidewall of the first via hole 142. Accordingly, a sidewall of the light emitting layer 112 and a sidewall of the second semiconductor layer 113 inside the first via hole 142 may not be exposed to the outside by the insulating layer 143, and only an upper surface of the first semiconductor layer 111 may be exposed to the outside without being covered by the insulating layer 143. The insulating layer 143 may also be disposed to cover the upper surface of the semiconductor structure 110 and the upper surface of the fixing layer 141. When the fixing layer 141 is not on the upper surface of the barrier 131, the insulating layer 143 may cover an upper surface of the barrier 131. The second via hole 144 may be formed to extend through the insulating layer 143 and the functional layer 120 through etching to expose a portion of an upper surface of the semiconductor layer 113.

Figure 4E:
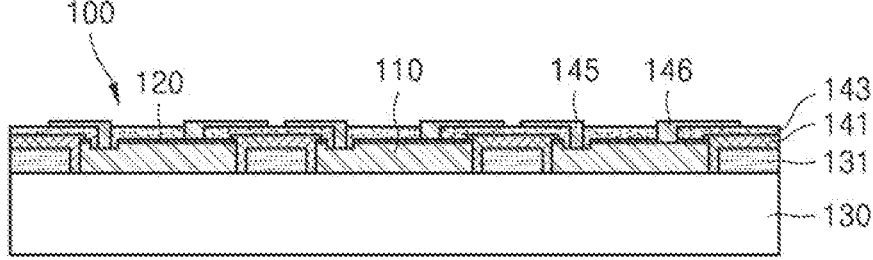
Figure 5C:
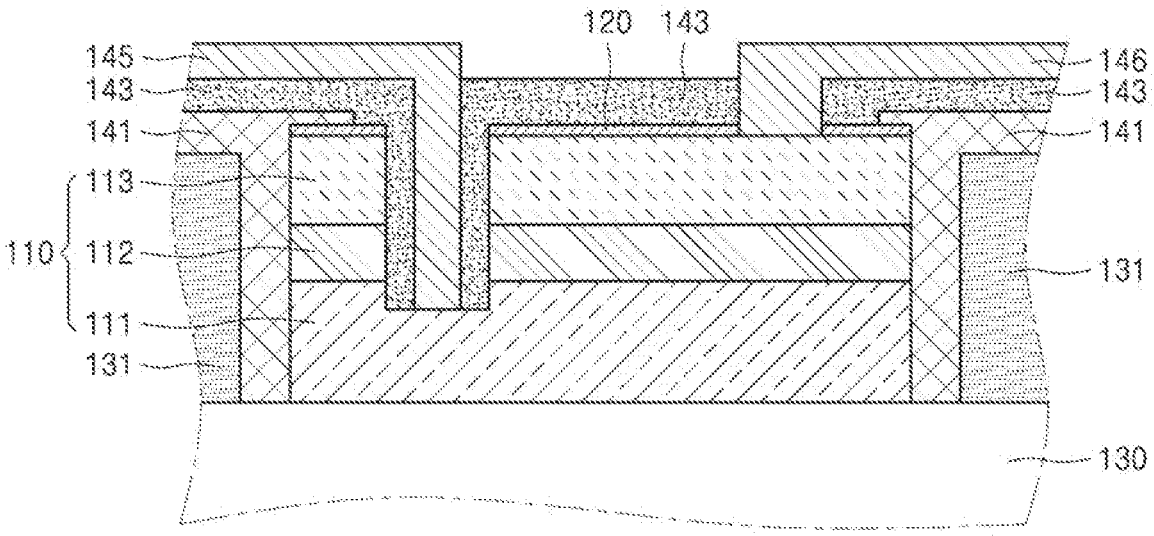
FIG. 5C is a cross-sectional view illustrating a structure after performing a process illustrated in FIG. 4E.

Referring to FIG. 4E, the first via hole 142 and the second via hole 144 may be filled to form a first electrode 145 and a second electrode 146. FIG. 5C is a cross-sectional view illustrating a structure after performing the process illustrated in FIG. 4E. Referring to FIG. 5C, the first electrode 145 filling the first via hole 142 may be electrically connected to the first semiconductor layer 111. The first electrode 145 may extend in a lateral direction on the upper surface of the semiconductor structure 110 and be disposed to protrude in the lateral direction with respect to the sidewall of the semiconductor structure 110. For example, the first electrode 145 may extend in the lateral direction to face the fixing layer 141 and the barrier 131 in a vertical direction. The second electrode 146 filling the second via hole 144 may be electrically connected to the second semiconductor layer 113. The second electrode 146 may also extend in a lateral direction toward an opposite side of the first electrode 145. For example, the second electrode 146 may extend in the lateral direction on the upper surface of the semiconductor structure 110 so as to face the fixing layer 141 and the barrier 131 opposite the first electrode 145 in a vertical direction to protrude in the lateral direction with respect to the sidewall of the semiconductor structure 110.

A semiconductor light emitting device 100 may be completed by forming the first electrode 145 and the second electrode 146 on the transfer substrate 130 in the manner described above. The semiconductor light emitting devices 100 formed on the transfer substrate 130 may be individually separated one by one and transferred onto a display substrate, or may be separated in units of modules that is a bundle of the semiconductor light emitting devices 100 and transferred onto the display substrate, or may be transferred onto the display substrate in units of panels including two-dimensionally arranged semiconductor light emitting devices 100.

Figure 6:
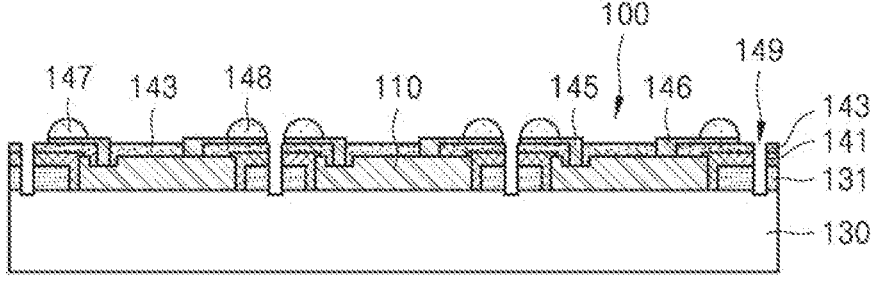
FIG. 6 is a cross-sectional view illustrating a state in which bumps are formed and the individually separated semiconductor light emitting devices are formed after the process illustrated in FIG. 4E.

FIG. 6 is a cross-sectional view illustrating a state in which bumps are formed and the individually separated semiconductor light emitting devices are formed after the process illustrated in FIG. 4E. Referring to FIG. 6, a first bump 147 and a second bump 148 may be formed on the first electrode 145 and the second electrode 146, respectively. For example, the first bump 147 and the second bump 148 may include a solder bump, a gold (Au) bump, or an under bump metallurgy (UBM). In addition, portions of the fixing layer 141 and the barrier 131 may be etched to form a trench 149 provided adjacent to and surrounding each semiconductor light emitting device 100. However, the first bump 147 and the second bump 148 may be formed after the trench 149 is first formed. In addition, the first bump 147 and the second bump 148 may be omitted, and the first bump 147 and the second bump 148 may be selectively formed depending on a future use of the semiconductor light emitting device 100.

As described so far, according to the example embodiment, after the semiconductor structure 110 is formed on the growth substrate 101, the semiconductor structure 110 is transferred to the separated transfer substrate 130, and the first electrode 145 and the second electrode 146 are formed on the transfer substrate 130. Therefore, positions of the first electrode 145 and the second electrode 146 may be adjusted relatively freely compared to a case in which the first electrode 145 and the second electrode 146 are directly formed on the growth substrate 101, and the first electrode 145 and the second electrode 146 may be more easily formed. For example, the positions of the first electrodes 145 and the second electrodes 146 of the semiconductor light emitting devices 100 formed on the transfer substrate 130 are designed to correspond to positions of electrode pads on the display substrate of the display apparatus, for example, the semiconductor light emitting devices 100 may be mounted directly from the transfer substrate 130 to the display substrate.

The semiconductor light emitting device 100 manufactured in this manner may have the first electrode 145 and the second electrode 146 that protrude more laterally than the sidewall of the semiconductor structure 110. Therefore, even when the size of the semiconductor structure 110 is relatively small, an interval between the first electrode 145 and the second electrode 146 may be sufficiently wide, thereby reducing a possibility of defects due to an alignment error when the semiconductor light emitting device 100 is transferred onto the display substrate. Therefore, for example, a defect rate may be lowered in manufacturing the display apparatus. In addition, because it is not necessary to directly form the first electrode 145 and the second electrode 146 on the growth substrate 101, the size of the semiconductor structure 110 may be further reduced without being limited to a limitation of the interval between the first electrode 145 and the second electrode 146, and a larger number of semiconductor structures 110 may be manufactured on a single growth substrate 101.

Figure 7A:
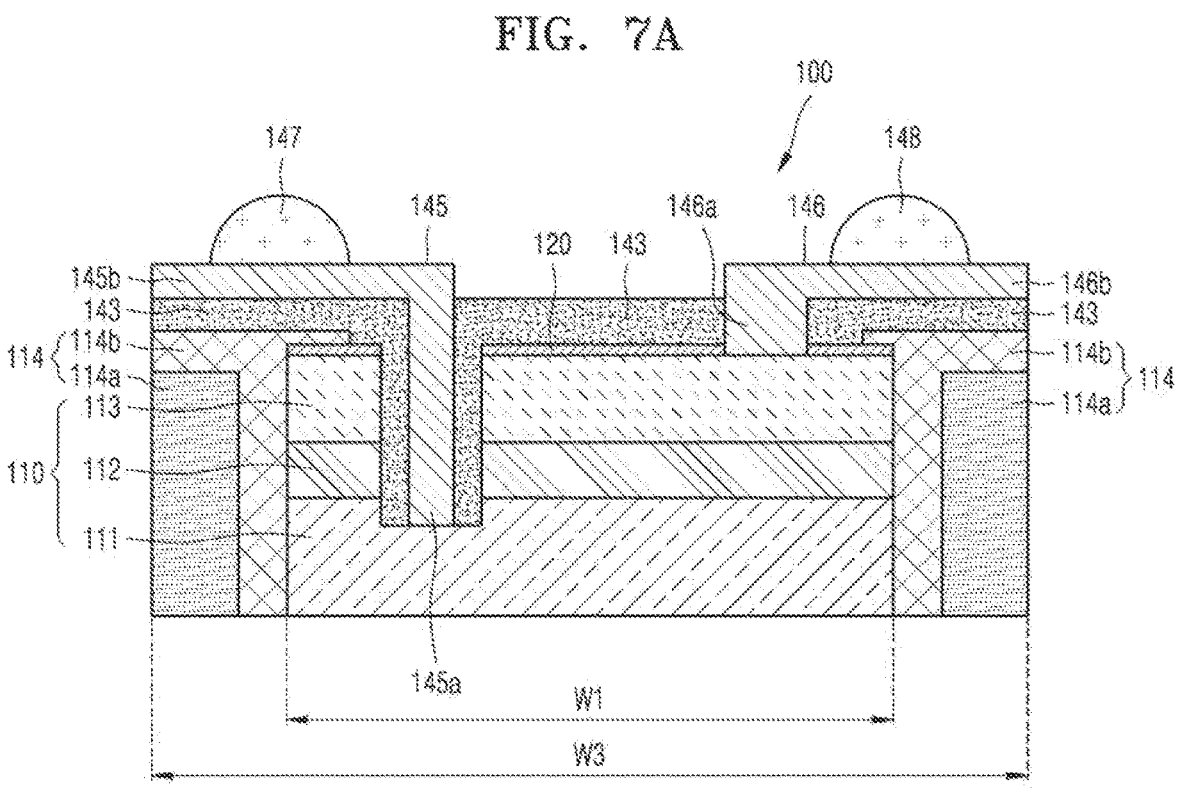
FIG. 7A is a cross-sectional view schematically illustrating a structure of a semiconductor light emitting device according to an embodiment.

FIG. 7A is a cross-sectional view schematically illustrating a structure of the semiconductor light emitting device 100 according to an example embodiment. Referring to FIG. 7A, the semiconductor light emitting device 100 may include a semiconductor structure 110 including a first semiconductor layer 111, a light emitting layer 112, and a second semiconductor layer 113, a side extension structure 114 surrounding and provided adjacent to a sidewall of the semiconductor substrate 110, a first electrode 145 electrically connected to the first semiconductor layer 111 through the second semiconductor layer 113 and the light emitting layer 112, and a second electrode 146 electrically connected to the second semiconductor layer 113. The first electrode 145 may include a first portion 145a electrically connected to the first semiconductor layer 111 extending in a vertical direction and a second portion 145b extending on an upper surface of the side extension structure 114 in a horizontal direction. In addition, the second electrode 146 may include a first portion 146a electrically connected to the second semiconductor layer 113 extending in a vertical direction and a second portion 146b extending on the upper surface of the side extension structure 114 in the horizontal direction. A portion of the second portion 145b of the first electrode 145 and a portion of the second portion 146b of the second electrode 146 may extend by the sidewall of the semiconductor structure 110 in mutually opposite horizontal directions and may be supported on the side extension structures 114 on mutually opposite sides.

In addition, the semiconductor light emitting device 100 may further include an insulating layer 143 disposed on an upper surface of the second semiconductor layer 113 and an upper surface of the side extension structure 114. The insulating layer 143 may be disposed adjacent to and to surround a sidewall of the first portion 145a of the first electrode 145 inside the second semiconductor layer 113 and the light emitting layer 112 so that the first electrode 145 is not in contact with the second semiconductor layer 113 and the light emitting layer 112. In addition, the first portion 146a of the second electrode 146 may be in contact with the second semiconductor layer 113 through the insulating layer 143. The second portion 145b of the first electrode 145 and the second portion 146b of the second electrode 146 may extend through the insulating layer 143 and be disposed on the upper surface of the insulating layer 143. The insulating layer 143 may extend between an upper surface of the side extension structure 114 and the second portion 145b of the first electrode 145 and between the upper surface of the side extension structure 114 and the second portion 146b of the second electrode 146.

In addition, the semiconductor light emitting device 100 may further include a functional layer 120 disposed on a surface of the second semiconductor layer 113. The functional layer 120 may include a metal or a transparent conductor. When the functional layer 120 includes a metal, the functional layer 120 may serve as a reflective layer that reflects light generated by the light emitting layer 112. In addition, when the functional layer 120 includes a transparent conductor, the functional layer 120 may serve as a current diffusion layer that diffuses a current applied from the second electrode 146 to the entire region of the second semiconductor layer 113. As described above, the functional layer 120 may perform a function of helping a vertical alignment of the semiconductor structure 110 when the semiconductor structure 110 is aligned on the transfer substrate 130. The functional layer 120 may be disposed between the second semiconductor layer 113 and the insulating layer 143. In particular, the functional layer 120 may be disposed to directly contact an upper surface of the second semiconductor layer 113.

The side extension structure 114 may include a first side extension structure 114a apart from the sidewall of the semiconductor structure 110 and surrounding and provided adjacent to the sidewall of the semiconductor structure 110 and a second side extension structure 114b disposed between the sidewall of the semiconductor structure 110 and the first side extension structure 114a. The first side extension structure 114a may be a portion of the barrier 131 disposed on the upper surface of the transfer substrate 130 in the process of forming the semiconductor light emitting device 100 on the transfer substrate 130. In addition, the second side extension structure 114b is a portion of the fixing layer 141 filling the gap between the semiconductor structure 110 and the barrier 131 in the process of forming the semiconductor light emitting device 100 on the transfer substrate 130. A portion of the second side extension structure 114b may extend from an upper surface of the first side extension structure 114a. Then, the insulating layer 143 may be in direct contact with the upper surface of the second side extension structure 114b.

The semiconductor light emitting device 100 may further include a first bump 147 disposed on the first electrode 145 and a second bump 148 disposed on the second electrode 146. At least a portion of the first bump 147 may be disposed to extend by the sidewall of the semiconductor structure 110 and face the upper surface of the side extension structure 114 in a vertical direction. For example, the first bump 147 may be disposed on the second portion 145b of the first electrode 145. Also, at least a portion of the second bump 148 may be disposed to extend through the sidewall of the semiconductor substrate 110 opposite to the first bump 147 and face the upper surface of the side extension structure 114 in a vertical direction. For example, the second bump 148 may be disposed on the second portion 146b of the second electrode 146.

Because the semiconductor light emitting device 100 according to the example embodiment includes the first electrode 145 and the second electrode 146 extending to the side to protrude more than the sidewall of the semiconductor structure 110 and the side extension structure 114 surrounding and provided adjacent to the sidewall of the semiconductor structure 110, a width or diameter W3 of the semiconductor light emitting device 100 may be greater than a width or diameter W1 of the semiconductor structure 110. The width or diameter W3 of the semiconductor light emitting device 100 may be 1.5 to 2.5 times the width or diameter W1 of the semiconductor structure 110. For example, the width or diameter W1 of the semiconductor structure 110 may be 1 μm to 100 μm, and the width or diameter W3 of the semiconductor light emitting device 100 may be 1.5 μm to 250 μm.

Figure 7B:
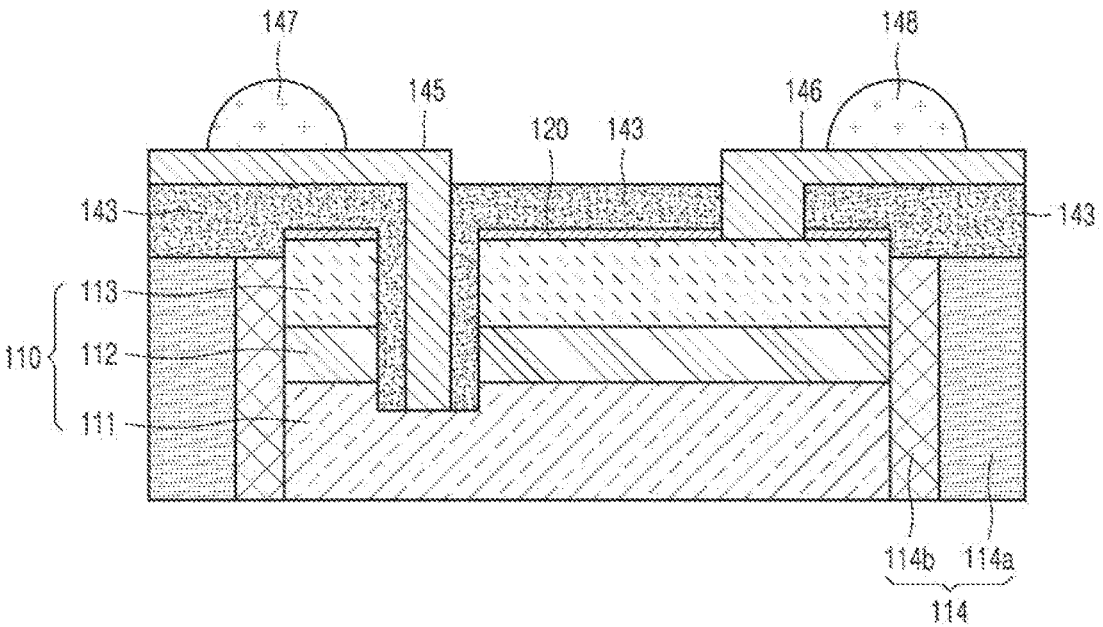
FIG. 7B is a cross-sectional view schematically illustrating a structure of a semiconductor light emitting device according to another example embodiment.

FIG. 7B is a cross-sectional view schematically illustrating a structure of the semiconductor light emitting device 100 according to another example embodiment. As described in FIG. 4B, the fixing layer 141 may be disposed only between the semiconductor structure 110 and the barrier 131, and the fixing layer 141 may not be on the upper surface of the barrier 131. Then, the second side extension structure 114b of the semiconductor light emitting device 100 may be disposed only between the sidewall of the semiconductor structure 110 and the first side extension structure 114a. In this case, the insulating layer 143 may directly contact the upper surface of the first side extension structure 114a and the upper surface of the second side extension structure 114b.

Figure 8A:
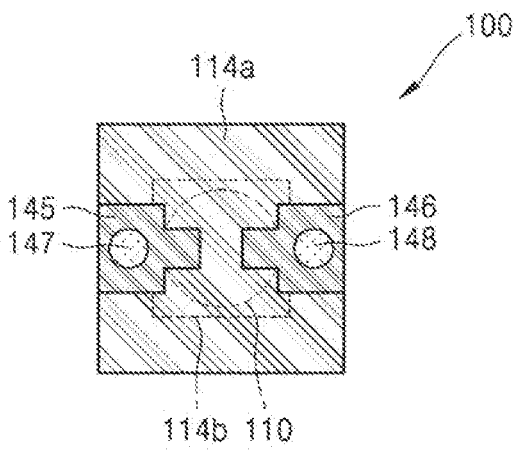
FIGS. 8A, 8B, 8C, and 8D are plan views illustrating various shapes of semiconductor light emitting devices according to an example embodiment.
Figure 8B:
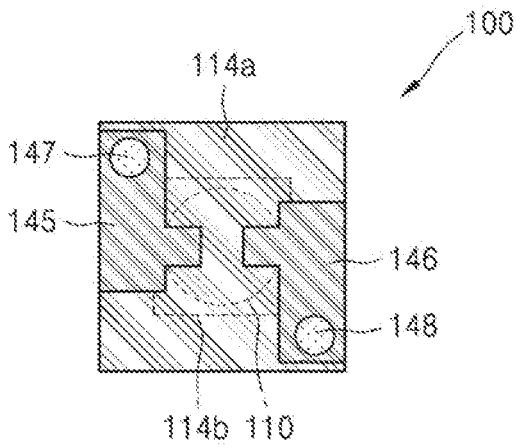
Figure 8C:
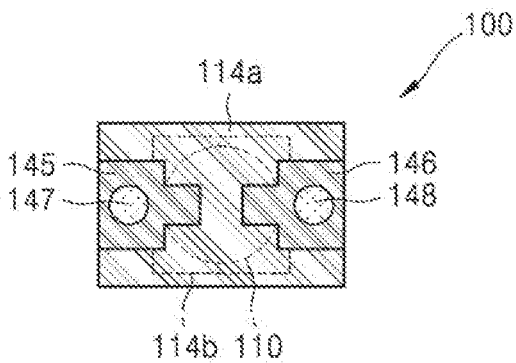
Figure 8D:
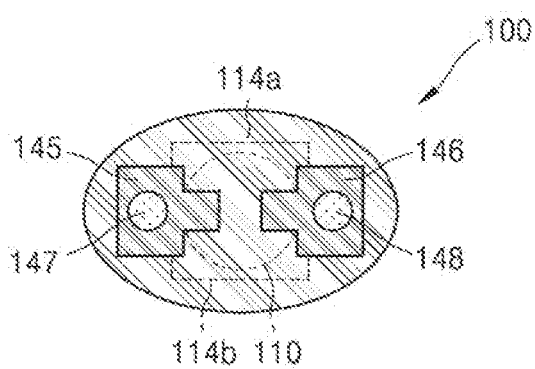

In addition, according to the example embodiment, a shape and a size of the semiconductor light emitting device 100 may be relatively freely selected according to a size and shape of the barrier 131 or a position of the trench 149. FIGS. 8A to 8D are plan views illustrating various shapes of the semiconductor light emitting device 100. Referring to FIG. 8A, the semiconductor light emitting device 100 may have a square shape. The first electrode 145 and the second electrode 146 may protrude from both sides of the semiconductor structure 110 to extend. In addition, referring to FIG. 8C, the semiconductor light emitting device 100 may have a rectangular shape. Referring to FIG. 8B, the semiconductor light emitting device 100 may have a square shape, and the first electrode 145 and the second electrode 146 may further extend in both diagonal directions of the semiconductor light emitting device 100. In addition, the first bump 147 and the second bump 148 may be disposed on opposite sides of the semiconductor light emitting device 100 in a diagonal direction. Referring to FIG. 8D, the semiconductor light emitting device 100 may have a circular or elliptical shape. The shape of the semiconductor light emitting device 100 is not limited to the shapes illustrated in FIGS. 8A to 8D, and may be various other shapes.

The semiconductor light emitting device 100 completed on the transfer substrate 130 through the method described above may be transferred and stored on a carrier substrate if necessary, or may be directly mounted on the display substrate.

Figure 9A:
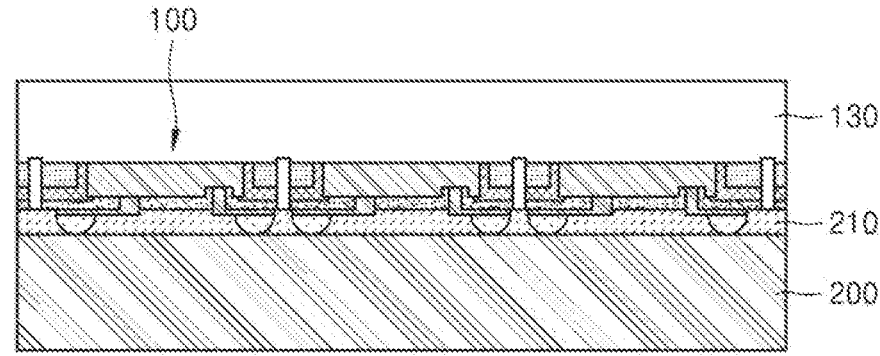
FIGS. 9A and 9B are cross-sectional views illustrating a process of transferring the individually separated semiconductor light emitting devices on a carrier substrate and then detaching them from the transfer substrate according to an example embodiment.
Figure 9B:
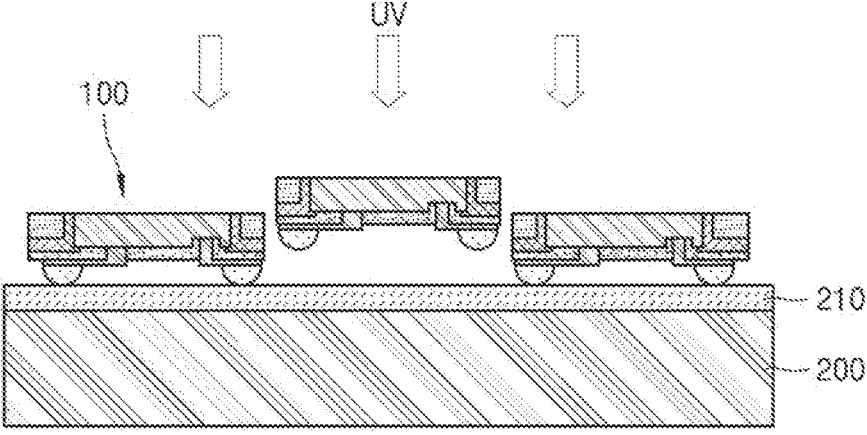

FIGS. 9A and 9B are cross-sectional views illustrating a process of transferring the individually separated semiconductor light emitting devices on a carrier substrate and then detaching them from the transfer substrate according to an example embodiment. Referring to FIG. 9A, the transfer substrate 130 on which the semiconductor light emitting devices 100 are formed may be disposed on a carrier substrate 200. For example, the transfer substrate 130 may be disposed such that the first bump 147 and the second bump 148 face an upper surface of the carrier substrate 200. A photosensitive adhesive 210 is applied on the upper surface of the carrier substrate 200, and thus, the semiconductor light emitting device 100 may be fixed on the carrier substrate 200. Thereafter, the transfer substrate 130 may be detached from the semiconductor light emitting device 100. As described above, when a sacrificial layer is further disposed between the barrier 131 and the transfer substrate 130, the transfer substrate 130 may be easily detached. According to another example embodiment, when the transfer substrate 130 is a thin film, the transfer substrate 130 may be more easily detached. Then, the individually separated semiconductor light emitting devices 100 may be arranged on the carrier substrate 200. Thereafter, at the time of using the semiconductor light emitting device 100, when ultraviolet rays, for example, are irradiated to the photosensitive adhesive 210 as shown in FIG. 9B, an adhesive force of the photosensitive adhesive 210 may be weakened and the semiconductor light emitting device 100 may be detached from the carrier substrate 200.

Figure 10A:
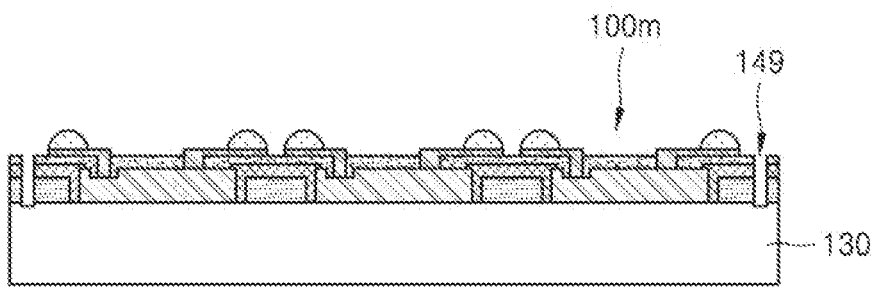
FIG. 10A is a cross-sectional view illustrating a state in which bumps are formed and a semiconductor light emitting device module including a plurality of semiconductor light emitting devices is formed after the process illustrated in FIG. 4E.
Figure 10B:
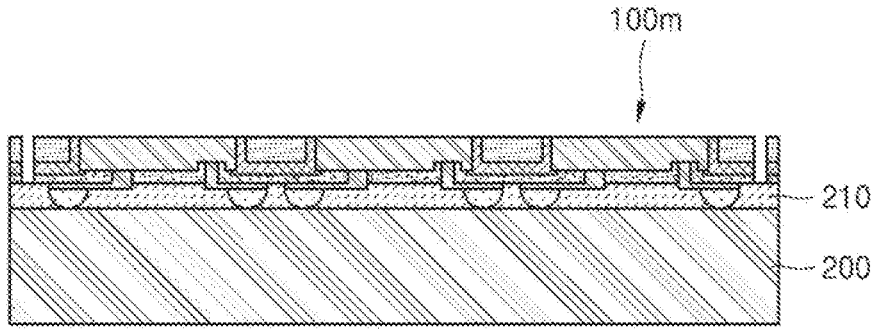
FIG. 10B is a cross-sectional view illustrating a process of transferring a module including a plurality of semiconductor light emitting devices onto a carrier substrate.
Figure 10C:
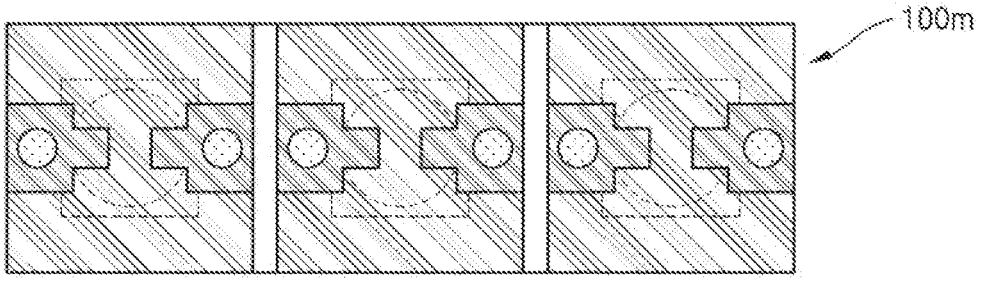
FIG. 10C is a plan view illustrating a shape of a semiconductor light emitting device module.

The semiconductor light emitting device 100 may be used as a module unit, which is a bundle of semiconductor light emitting devices 100. FIG. 10A is a cross-sectional view illustrating a state in which bumps are formed and a module including the semiconductor light emitting devices is formed after the process illustrated in FIG. 4E, FIG. 10B is a cross-sectional view illustrating a process of transferring the module including the semiconductor light emitting devices onto a carrier substrate, and FIG. 10C is a plan view illustrating a shape of the semiconductor light emitting device module.

Referring to FIG. 10A, a trench 149 surrounding the semiconductor light emitting devices 100 may be formed. A bundle of the semiconductor light emitting devices 100 disposed together within the trench 149 may form a semiconductor light emitting device module 100m. For example, although the semiconductor light emitting device module 100m is illustrated as including three semiconductor light emitting devices 100 in FIG. 10A, embodiments are not limited thereto. For example, the number of semiconductor light emitting devices 100 included in the semiconductor light emitting device module 100m may be equal to the number of semiconductor light emitting devices 100 disposed in one pixel of the display apparatus. In this case, one semiconductor light emitting device module 100m may have a size of one pixel of the display apparatus, and may be mounted on a driving device to serve as one pixel of the display apparatus. In the semiconductor light emitting device moduel 100m, two semiconductor light emitting devices 100 which are disposed adjacent to each other may share a side extension structure disposed between the two semiconductor light emitting devices 100.

The semiconductor light emitting devices 100 may be transferred to the display substrate or transferred to and stored on the carrier substrate 200 in units of modules. Referring to FIG. 10B, after the semiconductor light emitting device module 100m is transferred onto the carrier substrate 200, the transfer substrate 130 may be separated. Referring to FIG. 10C, the semiconductor light emitting device module 100m may have a shape including the semiconductor light emitting devices 100 connected in a row.

Figure 11A:
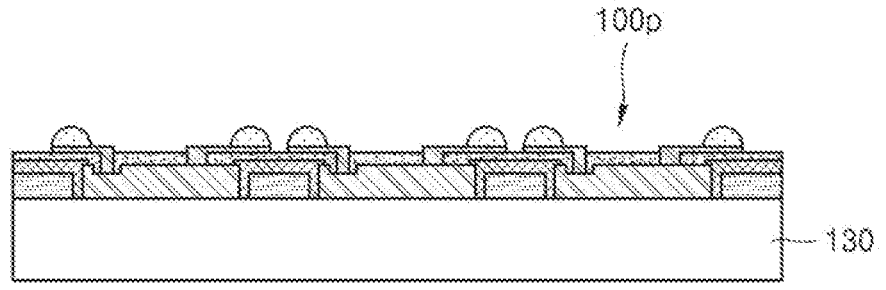
FIG. 11A is a cross-sectional view illustrating a state in which bumps are formed and a semiconductor light emitting device panel including a plurality of semiconductor light emitting devices is formed after the process illustrated in FIG. 4E, and FIGS. 11B and 11C are cross-sectional views illustrating a process of transferring a semiconductor light emitting device panel onto a display substrate according to an example embodiment.
Figure 11B:
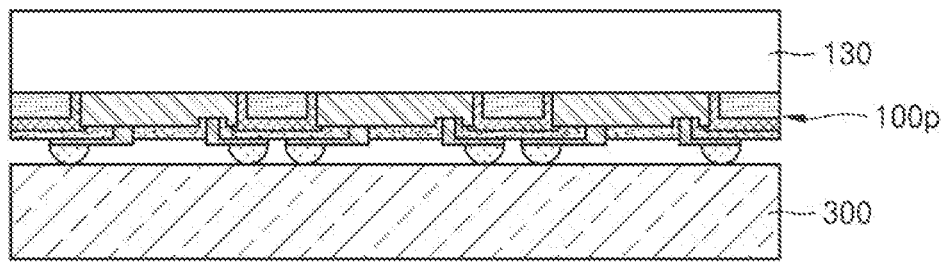
Figure 11C:
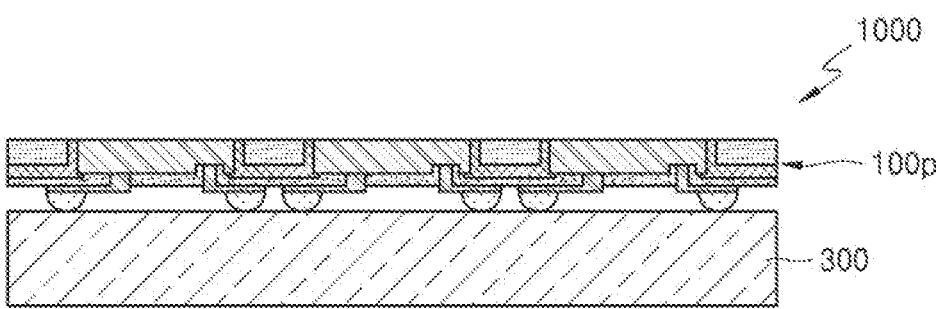

In addition, the semiconductor light emitting device 100 may be used as a panel unit, which is a bundle of semiconductor light emitting devices 100 arranged in two dimensions. FIG. 11A is a cross-sectional view illustrating a state in which bumps are formed and a semiconductor light emitting device panel including the semiconductor light emitting devices 100 is formed after the process illustrated in FIG. 4E, and FIGS. 11B and 11C are cross-sectional views illustrating a process of transferring the semiconductor light emitting device panel onto a display substrate.

Referring to FIG. 11A, all the semiconductor light emitting devices 100 formed on the transfer substrate 130 may form one semiconductor light emitting device panel 100p. In the semiconductor light emitting device panel 100p, two semiconductor light emitting devices 100 which are disposed adjacent to each other may share a side extension structure disposed between the two semiconductor light emitting devices 100. According to another example embodiment, the semiconductor light emitting devices 100 formed on the transfer substrate 130 may be divided into two-dimensional regions to form a plurality of semiconductor light emitting device panels 100p. Referring to FIG. 11B, the semiconductor light emitting device panel 100p may be directly transferred onto a display substrate 300. For example, the transfer substrate 130 may be disposed on the display substrate 300 so that the first bump 147 and the second bump 148 contact corresponding electrode pads on an upper surface of the display substrate 300. After the semiconductor light emitting device panel 100p is mounted on the display substrate 300, the transfer substrate 130 may be removed, thereby manufacturing a display panel 1000 of the display apparatus as illustrated in FIG. 11C. The semiconductor light emitting device panel 100p may have, for example, the same size as that of the entire display panel 1000 of the display apparatus. According to another example embodiment, the display panel 1000 may be manufactured by two-dimensionally arranging the plurality of semiconductor light emitting device panels 100p on the display substrate 300.

Figure 12:
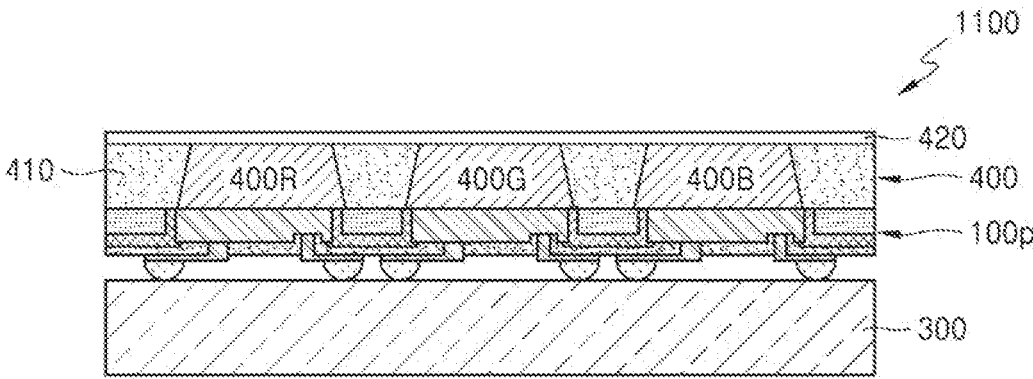
FIG. 12 is a cross-sectional view schematically illustrating a structure of a display apparatus according to an example embodiment.

FIG. 12 is a cross-sectional view schematically illustrating a structure of a display apparatus 1100 according to an example embodiment. Referring to FIG. 12, the display apparatus 1100 may include the display substrate 300, the semiconductor light emitting device panel 100p mounted on the display substrate 300, and a wavelength conversion layer 400 disposed on the semiconductor light emitting device panel 100p. In addition, the display apparatus 1100 may further include an upper substrate 420 disposed on the wavelength conversion layer 400. Although the semiconductor light emitting device panel 100*p* is illustrated to be used in FIG. 12, the semiconductor light emitting device module 100*m* or the individual semiconductor light emitting device 100 may also be used.

The wavelength conversion layer 400 may include a first wavelength conversion layer 400R converting light emitted from the semiconductor light emitting device 100 into light having a first wavelength band, a second wavelength conversion layer 400G converting the light emitted from the semiconductor light emitting device 100 into light having a second wavelength band, and a third wavelength conversion layer 400B converting the light emitted from the semiconductor light emitting device 100 into light having a third wavelength band that is different from the first and second wavelength bands. For example, the light having the first wavelength band may be red light, the light having the second wavelength band may be green light, and the light having the third wavelength band may be blue light. The first wavelength conversion layer 400R, the second wavelength conversion layer 400G, and the third wavelength conversion layer 400B may be spaced apart from each other with a partition 410 therebetween and may face corresponding semiconductor light emitting devices 100, respectively.

When the semiconductor light emitting device 100 emits blue light, the third wavelength conversion layer 400B may include a resin that transmits blue light. The second wavelength conversion layer 400G may convert blue light emitted from the semiconductor light emitting device 100 to emit green light. The second wavelength conversion layer 400G may include quantum dots or phosphor excited by blue light to emit green light. The first wavelength conversion layer 400R may change blue light emitted from the semiconductor light emitting device 100 into red light to be emitted. The first wavelength conversion layer 400R may include quantum dots or phosphor excited by blue light and emit red light.

The quantum dots included in the first wavelength conversion layer 400R or the second wavelength conversion layer 400G may have a core-shell structure having a core portion and a shell portion or may have a particle structure without a shell. The core-shell structure may include a single shell structure or a multi-shell structure, e.g., a double-shell structure. The quantum dots may include a group II-VI series semiconductor, a group III-V series semiconductor, a group IV-VI series semiconductor, a group IV series semiconductor, and/or graphene quantum dots. The quantum dots may include, for example, cadmium (Cd), selenium (Se), zinc (Zn), sulfur (S), and/or indium phosphide (InP), and each quantum dot may have a diameter that is less than or equal to tens of nm, for example, a diameter less than or equal to about 10 nm. The quantum dots included in the first wavelength conversion layer 400R and the second wavelength conversion layer 400G may have different sizes.

Figure 13:
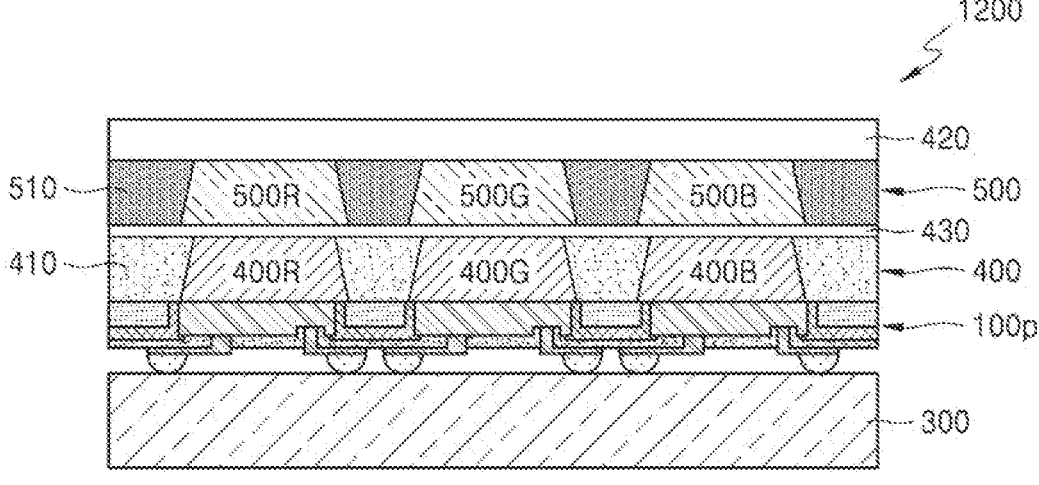
FIG. 13 is a cross-sectional view schematically illustrating a structure of a display apparatus according to another example embodiment.

FIG. 13 is a cross-sectional view schematically illustrating a structure of a display apparatus 1200 according to another example embodiment. Referring to FIG. 13, the display apparatus 1200 may further include a capping layer 430 on the wavelength conversion layer 400 and a color filter layer 500 on the capping layer 430. The capping layer 430 and the color filter layer 500 may be disposed between the wavelength conversion layer 400 and the upper substrate 420 of the display apparatus 1200 illustrated in FIG. 13. The color filter layer 500 includes a first filter 500R, a second filter 500G, and a third filter 500B apart from each other with a black matrix 510 therebetween. The first filter 500R, the second filter 500G, and the third filter 500B face the first wavelength conversion layer 400R, the second wavelength conversion layer 400G, and the third wavelength conversion layer 400B, respectively. The first filter 500R, the second filter 500G, and the third filter 500B transmit red light, green light, and blue light, respectively, and absorb light of other colors. When the color filter layer 500 is provided, light other than red light emitted without wavelength conversion from the first wavelength conversion layer 400R or light other than green light emitted without wavelength conversion from the second color conversion layer 400G may be removed by the first filter 500R and the second filter 500G, respectively, thereby increasing color purity of the display apparatus 1200.

Figure 14:
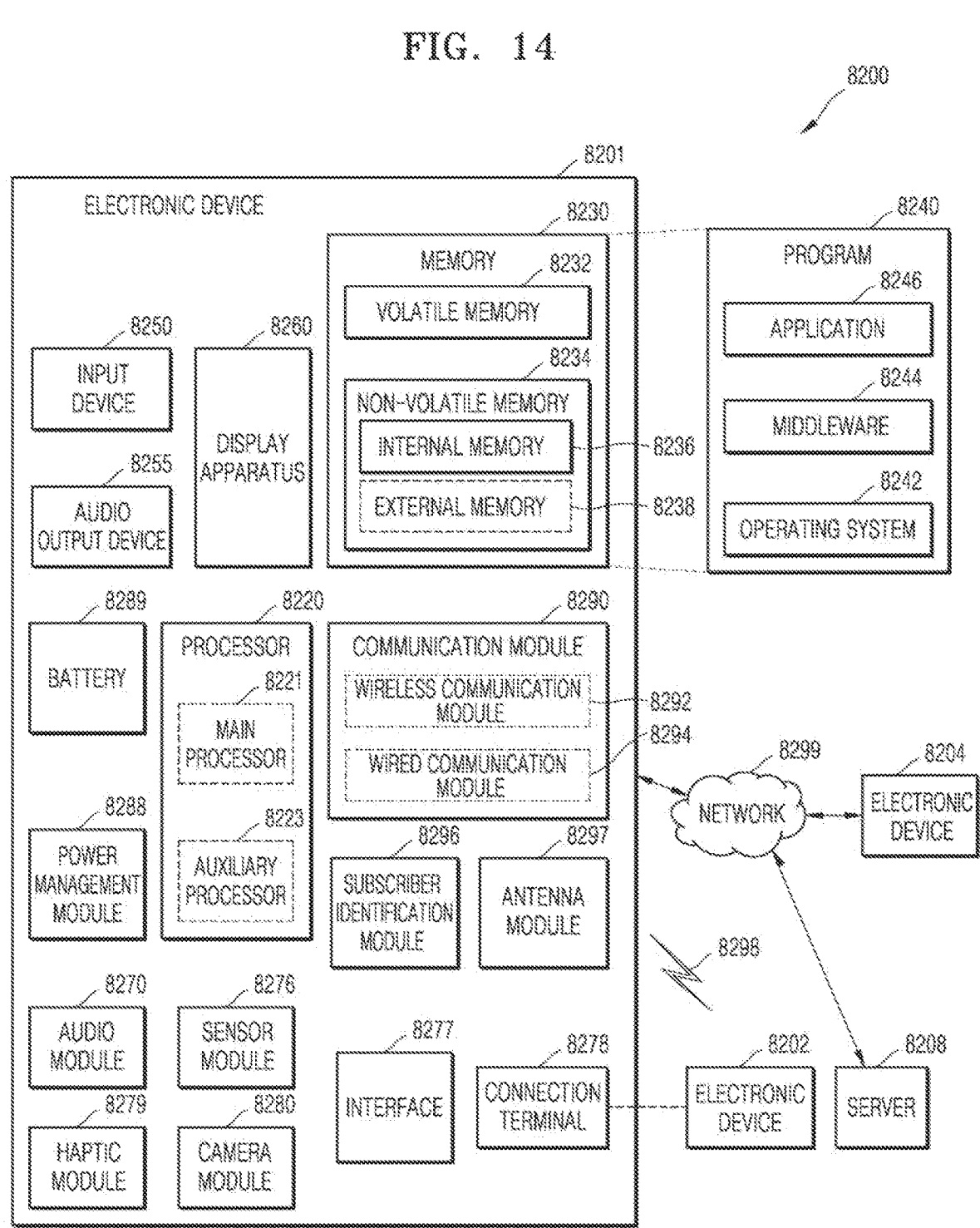
FIG. 14 is a schematic block diagram of an electronic device according to an example embodiment.

The display apparatuses described above may be applied to various electronic devices having a screen display function. FIG. 14 is a schematic block diagram of an electronic device 8201 according to an example embodiment. Referring to FIG. 14, the electronic device 8201 may be provided in a network environment 8200. In the network environment 8200, the electronic device 8201 may communicate with another electronic device 8202 through a first network 8298 (a short-range wireless communication network, etc.), or may communicate with another electronic device 8204 and/or a server 8208 through a second network 8299 (a long-range wireless communication network, etc.). The electronic device 8201 may communicate with the electronic device 8204 through the server 8208. The electronic device 8201 may include a processor 8220, a memory 8230, an input device 8250, an audio output device 8255, a display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of these components of the electronic device 8201 may be omitted or other components may be added to the electronic device 8201. Some of these components may be implemented as one integrated circuit. For example, the sensor module 8276 (a fingerprint sensor, an iris sensor, an illuminance sensor, etc.) may be included in the display apparatus 8260 (display, etc.).

The processor 8220 may execute software (a program 8240, etc.) to control one or a plurality of other components (hardware, software components, etc.) among electronic devices 8201 connected to the processor 8220 and perform various data processing or operations. As part of the data processing or operations, the processor 8220 may load instructions and/or data received from other components (the sensor module 8276, the communication module 8290, etc.) into a volatile memory 8232, process instructions and/or data stored in the volatile memory 8232, and store result data in a nonvolatile memory 8234. The nonvolatile memory 8234 may include an internal memory 8236 mounted in the electronic device 8201 and a detachable external memory 8238. The processor 8220 may include a main processor 8221 (a central processing unit, an application processor, etc.) and an auxiliary processor 8223 (a graphics processing unit, an image signal processor, a sensor hub processor, a communication processor, etc.) that may be operated independently or together with the main processor 8221. The auxiliary processor 8223 may use less power than the main processor 8221 and may perform specialized functions.

The auxiliary processor 8223 may control functions and/or states related to some (the display apparatus 8260, the sensor module 8276, the communication module 8290, etc.) of the components of the electronic device 8201 in place of the main processor 8221 while the main processor 8221 is inactive (a sleep state) or together with the main processor 8221 while the main processor 8221 is active (an application executed state). The auxiliary processor 8223 (an image signal processor, a communication processor, etc.) may be implemented as part of other functionally related components (the camera module 8280, the communication module 8290, etc.).

The memory 2230 may store various data required by the components (the processor 8220, the sensor module 8276, etc.) of the electronic device 8201. The data may include, for example, software (the program 8240, etc.) and input data and/or output data for commands related thereto. The memory 8230 may include the volatile memory 8232 and/or the nonvolatile memory 8234.

The program 8240 may be stored as software in the memory 8230 and may include an operating system 8242, middleware 8244, and/or an application 8246.

The input device 8250 may receive commands and/or data to be used by components (the processor 8220, etc. of the electronic device 8201) from the outside (a user, etc.) of the electronic device 8201. The input device 8250 may include a remote controller, a microphone, a mouse, a keyboard, and/or a digital pen (such as a stylus pen).

The audio output device 8255 may output an audio signal to the outside of the electronic device 8201. The audio output device 8255 may include a speaker and/or a receiver. The speaker may be used for general purposes such as multimedia playback or recording playback, and the receiver may be used to receive incoming calls. The receiver may be combined as part of the speaker or may be implemented as an independent separate device.

The display apparatus 8260 may visually provide information to the outside of the electronic device 8201. The display apparatus 8260 may include a display, a hologram device, or a projector, and a control circuit for controlling a corresponding device. The display apparatus 8260 may include the driving circuit, the micro-semiconductor light emitting device, the side reflective structure, the lower reflective structure, etc. The display apparatus 8260 may further include touch circuitry configured to detect a touch and/or a sensor circuit (a pressure sensor, etc.) configured to measure the strength of a force generated by the touch.

The audio module 8270 may convert sound into an electrical signal, or conversely, may convert an electrical signal into sound. The audio module 8270 may acquire sound through the input device 8250 and output sound through a speaker and/or a headphone of another electronic device (the electronic device 8202, etc.) connected to the audio output device 8255 and/or the electronic device 8201 directly or wirelessly.

The sensor module 8276 may detect an operating state (power, temperature, etc.) of the electronic device 8201 or an external environmental state (a user state, etc.), and generate an electrical signal and/or data value corresponding to the detected state. The sensor module 8276 may include a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, and/or an illuminance sensor.

The interface 8277 may support one or more designated protocols that may be used for the electronic device 8201 to be connected to another electronic device (e.g., the electronic device 8202) directly or wirelessly. The interface 8277 may include a high definition multimedia interface (HDMI), a universal serial bus (USB) interface, an SD card interface, and/or an audio interface.

A connection terminal 8278 may include a connector through which the electronic device 8201 may be physically connected to another electronic device (such as the electronic device 8202). The connection terminal 8278 may include an HDMI connector, a USB connector, an SD card connector, and/or an audio connector (such as a headphone connector).

The haptic module 8279 may convert an electrical signal into a mechanical stimulus (vibration, movement, etc.) or an electrical stimulus that a user may perceive through a tactile or motor sense. The haptic module 8279 may include a motor, a piezoelectric element, and/or an electrical stimulation device.

The camera module 8280 may capture a still image and video. The camera module 8280 may include a lens assembly including one or more lenses, image sensors, image signal processors, and/or flashes. The lens assembly included in the camera module 8280 may collect light emitted from a subject to be imaged.

The power management module 8288 may manage power supplied to the electronic device 8201. The power management module 8288 may be implemented as part of a power management integrated circuit (PMIC).

The battery 8289 may supply power to components of the electronic device 8201. The battery 8289 may include a non-rechargeable primary cell, a rechargeable secondary cell, and/or a fuel cell.

The communication module 8290 may establish a direct (wired) communication channel and/or a wireless communication channel between the electronic device 8201 and other electronic devices (the electronic device 8202, the electronic device 8204, the server 8208, etc.) and support communication through the established communication channel. The communication module 8290 may include one or more communication processors operating independently of the processor 8220 (an application processor, etc.) and supporting direct communication and/or wireless communication. The communication module 8290 may include a wireless communication module 8292 (a cellular communication module, a short-range wireless communication module, a global navigation satellite system (GNSS) communication module, etc.) and/or a wired communication module 8294 (a local area network (LAN) communication module, a power line communication module, etc.). Among these communication modules, a corresponding communication module may communicate with another electronic device through the first network 8298 (a short-range communication network such as Bluetooth, WiFi Direct, or infrared Data Association (IrDA) or the second network 8299 (a telecommunication network such as a cellular network, the Internet, or a computer network (LAN), WAN, etc.). These various types of communication modules may be integrated into one component (a single chip, etc.) or may be implemented as a plurality of components (multiple chips) separate from each other. The wireless communication module 8292 may verify and authenticate the electronic device 8201 in the communication network such as the first network 8298 and/or the second network 8299 using subscriber information (an international mobile subscriber identifier (IMSI), etc.) stored in the subscriber identification module 8296.

The antenna module 8297 may transmit signals and/or power to the outside (such as other electronic devices) or receive signals and/or power from the outside. The antenna may include a radiator including a conductive pattern formed on a board (a printed circuit board (PCB), etc.). The antenna module 8297 may include one or a plurality of antennas. When a plurality of antennas are included, an antenna suitable for a communication method used in a communication network such as the first network 8298 and/or the second network 8299 may be selected from among the plurality of antennas by the communication module 8290. Signals and/or power may be transmitted or received between the communication module 8290 and other electronic devices through the selected antenna. A component (an RFIC, etc.) other than the antenna may be included as part of the antenna module 8297.

Some of the components may be connected to each other through communication methods (a bus, a general purpose input and output (BPIO), a serial peripheral interface (SPI), a mobile industry processor interface (MIPI)) and exchange signals (commands, data, etc.) with each other.

The command or data may be transmitted or received between the electronic device 8201 and the electronic device 8204 through the server 8208 connected to the second network 8299. The other electronic devices 8202 and 8204 may be the same or different types of devices as the electronic device 8201. All or some of the operations executed by the electronic device 8201 may be executed by one or more of the other electronic devices 8202, 8204, and 8208. For example, when the electronic device 8201 needs to perform a function or service, the electronic device 8201 may request one or more other electronic devices to perform a portion or the entirety of the function or the service, instead of executing the function or service by itself. Upon receiving the request, one or more other electronic devices may execute an additional function or service related to the request, and transmit a result of the execution to the electronic device 8201. To this end, cloud computing, distributed computing, and/or client-server computing technology may be used.

Figure 15:
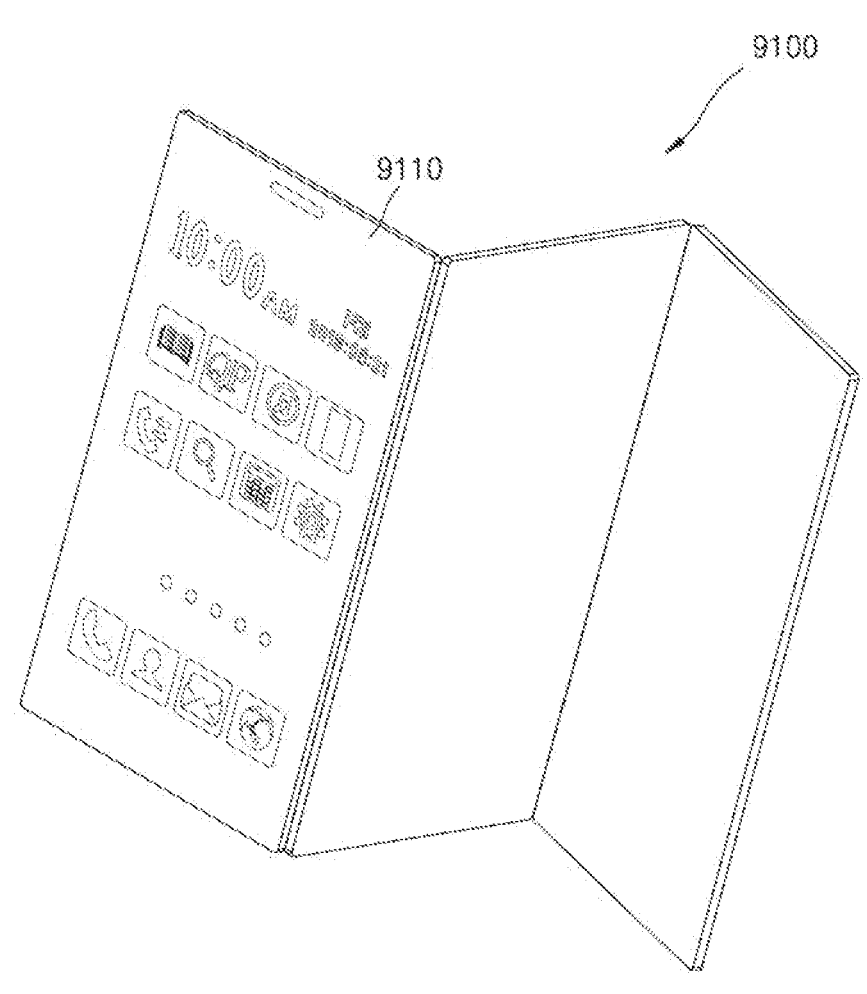
FIG. 15 illustrates an example in which a display apparatus according to example embodiments is applied to a mobile device.

FIG. 15 illustrates an example in which a display apparatus according to example embodiments is applied to a mobile device 9100. The mobile device 9100 may include a display apparatus 9110, and the display apparatus 9110 may include the driving circuit, the micro-semiconductor light emitting device, the side reflective structure, the lower reflective structure, and the like described above. The display apparatus 9110 may have a foldable structure, for example, a multi-foldable structure.

Figure 16:
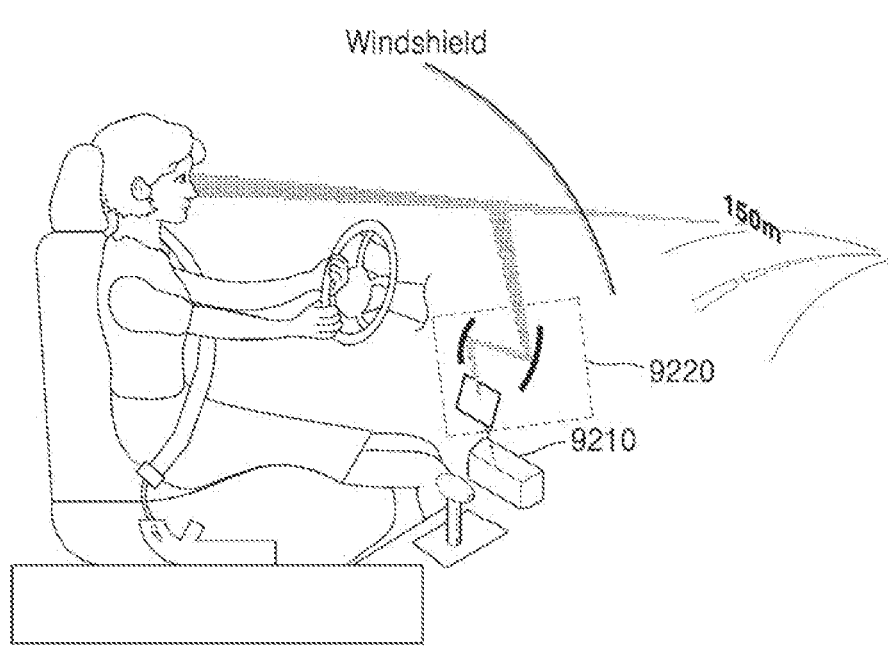
FIG. 16 illustrates an example in which a display apparatus according to example embodiments is applied to a vehicle display apparatus.

FIG. 16 illustrates an example in which the display apparatus according to the example embodiments is applied to a vehicle display apparatus. The display apparatus may be a head-up display apparatus 9200 for a vehicle and may include a display 9210 provided in a region of a vehicle and a light path changing member 9220 for changing a path of light so that a driver may see an image generated by the display 9210.

Figure 17:
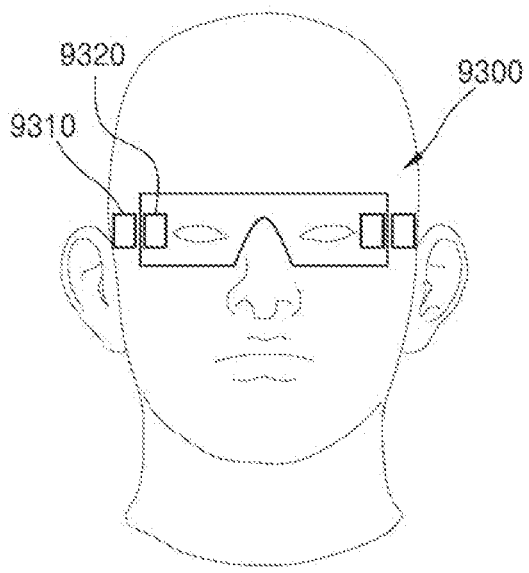
FIG. 17 illustrates an example in which a display apparatus according to example embodiments is applied to augmented reality glasses or virtual reality glasses.

FIG. 17 illustrates an example in which the display apparatus according to example embodiments is applied to augmented reality (AR) glasses 9300 or virtual reality glasses. The AR glasses 9300 may include a projection system 9310 forming an image and an element 9320 guiding the image from the projection system 9310 to a user's eye. The projection system 9310 may include the driving circuit, the micro-semiconductor light emitting device, the side reflective structure, the lower reflective structure, and the like described above.

Figure 18:
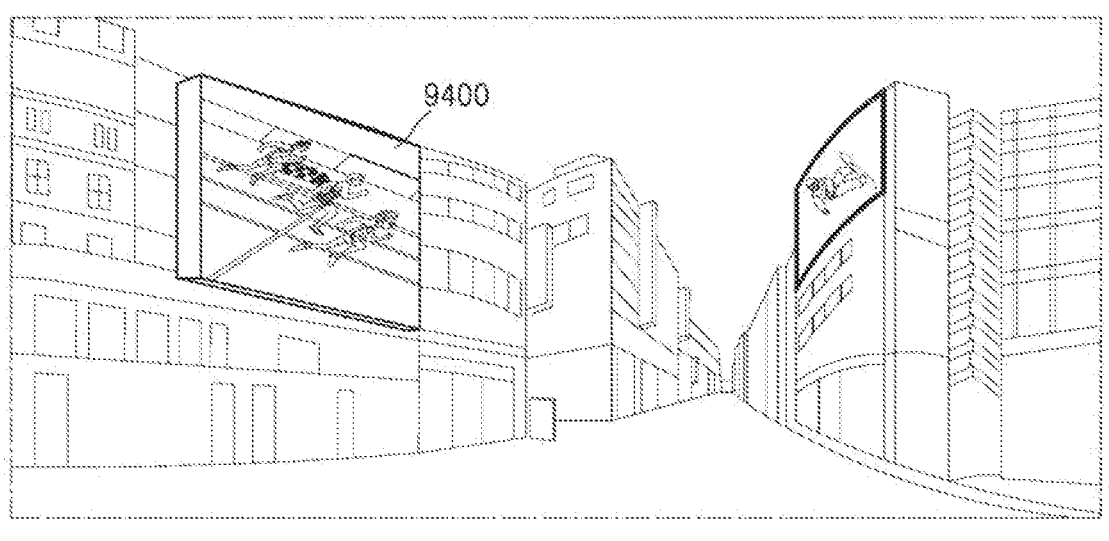
FIG. 18 illustrates an example in which a display apparatus according to example embodiments is applied to a signage.

FIG. 18 illustrates an example in which the display apparatus according to example embodiments is applied to a signage 9400. The signage 9400 may be used for outdoor advertisements using a digital information display and may control advertisement content and the like through a communication network. The signage 9400 may be implemented, for example, through the electronic device described above with reference to FIG. 14.

Figure 19:
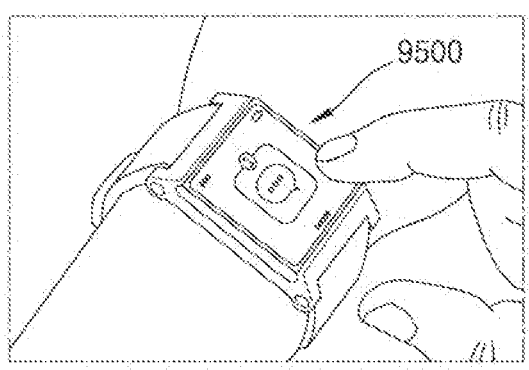
FIG. 19 illustrates an example in which a display apparatus according to example embodiments is applied to a wearable display.

FIG. 19 illustrates an example in which the display apparatus according to example embodiments is applied to a wearable display 9500. The wearable display 9500 may include the driving circuit, the micro-semiconductor light emitting device, the side reflective structure, the lower reflective structure, and the like described above and may be implemented through the electronic device described above with reference to FIG. 14.

The display apparatus according to an example embodiment may be applied to various products such as a rollable television (TV), a stretchable display, etc.

It should be understood that example embodiments described herein should be considered in a descriptive sense only and not for purposes of limitation. Descriptions of features or aspects within each example embodiment should typically be considered as available for other similar features or aspects in other embodiments. While example embodiments have been described with reference to the figures, it will be understood by those of ordinary skill in the art that various changes in form and details may be made therein without departing from the spirit and scope as defined by the following claims and their equivalents.

What is claimed is:

1. A semiconductor light emitting device comprising:
a semiconductor structure comprising a first semiconductor layer, a light emitting layer, and a second semiconductor layer;
a side extension structure disposed adjacent to a sidewall of the semiconductor structure;
a first electrode having a first portion extending through the second semiconductor layer and the light emitting layer and electrically connected to the first semiconductor layer, and a second portion extending on an upper surface of the side extension structure in a horizontal direction; and
a second electrode having a first portion electrically connected to the second semiconductor layer and a second portion extending on the upper surface of the side extension structure in the horizontal direction,
wherein a portion of the second portion of the first electrode and a portion of the second portion of the second electrode extend in mutually opposite horizontal directions to protrude more than an entirety of the sidewall of the semiconductor structure.

2. The semiconductor light emitting device of claim 1, wherein a portion of the second portion of the first electrode and a portion of the second portion of the second electrode extend by the sidewall of the semiconductor structure in the horizontal direction and are disposed on the side extension structure.

3. The semiconductor light emitting device of claim 1, further comprising an insulating layer disposed on a surface of the second semiconductor layer and a surface of the side extension structure.

4. The semiconductor light emitting device of claim 3, wherein the insulating layer is disposed adjacent to a sidewall of the first portion of the first electrode inside the second semiconductor layer and the light emitting layer such that the first electrode is spaced apart from the second semiconductor layer and the light emitting layer, and
wherein the first portion of the second electrode is in contact with the second semiconductor layer through the insulating layer.

5. The semiconductor light emitting device of claim 4, wherein the second portion of the first electrode and the second portion of the second electrode are disposed on a surface of the insulating layer.

6. The semiconductor light emitting device of claim 1, wherein the side extension structure comprises:

a first side extension structure spaced apart from the sidewall of the semiconductor structure and disposed adjacent to the sidewall of the semiconductor structure; and a second side extension structure disposed between the sidewall of the semiconductor structure and the first side extension structure.

7. The semiconductor light emitting device of claim 6, wherein the second side extension structure extends to an upper surface of the first side extension structure.

8. The semiconductor light emitting device of claim 1, further comprising:

a first bump disposed on the first electrode; and a second bump disposed on the second electrode.

9. The semiconductor light emitting device of claim 8, wherein at least a portion of the first bump and at least a portion of the second bump extend adjacent to the sidewall of the semiconductor structure and face a surface of the side extension structure.

10. The semiconductor light emitting device of claim 1, further comprising a functional layer disposed on a surface of the second semiconductor layer and including a metal or a transparent conductor.

11. The semiconductor light emitting device of claim 1, wherein a width or diameter of the semiconductor structure ranges from 1 μm to 100 μm.

12. The semiconductor light emitting device of claim 11, wherein a width or diameter of the semiconductor light emitting device is 1.5 to 2.5 times the width or diameter of the semiconductor structure.

13. A display apparatus comprising:

a display substrate including a driving circuit; and a plurality of semiconductor light emitting devices disposed on the display substrate, wherein each of the semiconductor light emitting devices comprises:

a semiconductor structure including a first semiconductor layer, a light emitting layer, and a second semiconductor layer;

a side extension structure disposed adjacent to a sidewall of the semiconductor structure;

a first electrode having a first portion extending through the second semiconductor layer and the light emitting layer and electrically connected to the first semiconductor layer, and a second portion extending on an upper surface of the side extension structure in a horizontal direction; and a second electrode having a first portion electrically connected to the second semiconductor layer and a second portion extending on the upper surface of the side extension structure in the horizontal direction, wherein a portion of the second portion of the first electrode and a portion of the second portion of the second electrode extend in mutually opposite horizontal directions to protrude more than an entirety of the sidewall of the semiconductor structure.

14. The display apparatus of claim 13, wherein the plurality of semiconductor light emitting devices comprises a first semiconductor light emitting device and a second semiconductor light emitting device disposed adjacent to each other, and wherein the first semiconductor light emitting device and the second semiconductor light emitting device share a single side extension structure disposed between the first semiconductor light emitting device and the second semiconductor light emitting device.

15. The display apparatus of claim 13, wherein the plurality of semiconductor light emitting devices are integrally formed.

16. The display apparatus of claim 13, further comprising a wavelength conversion layer configured to convert a wavelength of light emitted from the plurality of semiconductor light emitting devices.

17. The display apparatus of claim 16, wherein the wavelength conversion layer comprises:

a first wavelength conversion layer configured to convert light emitted from the plurality of semiconductor light emitting devices into light having a first wavelength band; and a second wavelength conversion layer configured to convert light emitted from the plurality of semiconductor light emitting devices into light having a second wavelength band different from the first wavelength band.

18. The display apparatus of claim 17, further comprising a color filter layer comprising:

a first filter facing the first wavelength conversion layer and configured to transmit light having the first wavelength band; and a second color filter layer facing the second wavelength conversion layer and configured to transmit light having the second wavelength band.

19. The display apparatus of claim 13, wherein a portion of the second portion of the first electrode and a portion of the second portion of the second electrode extend adjacent to the sidewall of the semiconductor structure in the horizontal direction and are disposed on the side extension structure.

20. The display apparatus of claim 13, wherein each of the semiconductor light emitting devices further comprises an insulating layer disposed on a surface of the second semiconductor layer and a surface of the side extension structure.

21. The display apparatus of claim 20, wherein the insulating layer is disposed adjacent to a sidewall of the first portion of the first electrode inside the second semiconductor layer and the light emitting layer such that the first electrode is spaced apart from the second semiconductor layer and the light emitting layer, and wherein the first portion of the second electrode is in contact with the second semiconductor layer through the insulating layer.

22. The display apparatus of claim 21, wherein the second portion of the first electrode and the second portion of the second electrode are disposed on a surface of the insulating layer.

23. The display apparatus of claim 13, wherein the side extension structure comprises:

a first side extension structure spaced apart from the sidewall of the semiconductor structure and disposed adjacent to the sidewall of the semiconductor structure; and a second side extension structure disposed between the sidewall of the semiconductor structure and the first side extension structure.

24. The display apparatus of claim 23, wherein the second side extension structure extends to an upper surface of the first side extension structure.

25. The display apparatus of claim 13, wherein each of the semiconductor light emitting devices comprises:

a first bump disposed on the first electrode; and a second bump disposed on the second electrode.

26. The display apparatus of claim 25, wherein at least a portion of the first bump and at least a portion of the second bump extend adjacent to the sidewall of the semiconductor structure and face a surface of the side extension structure.

27. The display apparatus of claim 13, wherein each of the semiconductor light emitting devices comprises a functional layer disposed on a surface of the second semiconductor layer and including a metal or a transparent conductor.

28. The display apparatus of claim 13, wherein a width or diameter of the semiconductor structure ranges from 1 μm to 100 μm.

29. The display apparatus of claim 28, wherein a width or diameter of each of the semiconductor light emitting devices is 1.5 to 2.5 times the width or diameter of the semiconductor structure.

30. A semiconductor light emitting device comprising:

a semiconductor structure comprising a first semiconductor layer, a light emitting layer, and a second semiconductor layer;

a side extension structure extending adjacent to a sidewall of the semiconductor structure;

a first electrode comprising:

a first portion extending in a vertical direction through the second semiconductor layer and the light emitting layer and in contact with the first semiconductor layer; and a second portion extending on an upper surface of the side extension structure in a horizontal direction; and a second electrode comprising:

a first portion extending in the vertical direction and in contact with the second semiconductor layer; and a second portion extending on the upper surface of the side extension structure in the horizontal direction, wherein a portion of the second portion of the first electrode and a portion of the second portion of the second electrode extend in mutually opposite horizontal directions to protrude more than an entirety of the sidewall of the semiconductor structure.

* * * * *